United States Patent
Nakayama et al.

(10) Patent No.: US 9,721,770 B2
(45) Date of Patent: *Aug. 1, 2017

(54) OXIDE SINTERED BODY, PRODUCTION METHOD THEREFOR, TARGET, AND TRANSPARENT CONDUCTIVE FILM

(71) Applicant: SUMITOMO METAL MINING CO., LTD., Tokyo (JP)

(72) Inventors: Tokuyuki Nakayama, Ichikawa (JP); Yoshiyuki Abe, Ichikawa (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 140 days.

This patent is subject to a terminal disclaimer.

(21) Appl. No.: 14/641,981

(22) Filed: Mar. 9, 2015

(65) Prior Publication Data
US 2015/0235820 A1 Aug. 20, 2015

Related U.S. Application Data

(62) Division of application No. 13/388,887, filed as application No. PCT/JP2010/062817 on Jul. 29, 2010, now Pat. No. 9,028,721.

(30) Foreign Application Priority Data
Aug. 5, 2009 (JP) .................... 2009-182761

(51) Int. Cl.
C23C 14/08 (2006.01)
H01B 1/08 (2006.01)
(Continued)

(52) U.S. Cl.
CPC .......... H01J 37/3429 (2013.01); C23C 14/08 (2013.01); C23C 14/3414 (2013.01);
(Continued)

(58) Field of Classification Search
CPC .......... H01B 1/00; H01B 1/08; C04B 35/645; C23C 14/08
See application file for complete search history.

(56) References Cited

U.S. PATENT DOCUMENTS 9,005,487 B2 * 4/2015 Nakayama .............. C04B 35/01
 204/192.15
9,028,721 B2 * 5/2015 Nakayama .............. C04B 35/01
 252/500
(Continued)

FOREIGN PATENT DOCUMENTS

JP 8-260134 A 10/1996
JP 9-176841 A 7/1997
(Continued)

OTHER PUBLICATIONS

"Technology of Transparent Conductive Oxide Thin-Films (the second revised version)", Ohmsha, Ltd., published on Dec. 20, 2006, pp. 238-239.
(Continued)

Primary Examiner — Mark Kopec
(74) Attorney, Agent, or Firm — Westerman, Hattori, Daniels & Adrian, LLP

(57) ABSTRACT

A target for sputtering which enables to attain high rate film-formation of a transparent conductive film suitable for a blue LED or a solar cell. A oxide sintered body includes an indium oxide and a cerium oxide, and one or more oxide of titanium, zirconium, hafnium, molybdenum and tungsten. The cerium content is 0.3 to 9% by atom, as an atomicity ratio of Ce/(In+Ce), and the content of cerium is equal to or lower than 9% by atom, as an atomicity ratio of Ce/(In+Ce). The oxide sintered body has an $In_2O_3$ phase of a bixbyite structure has a $CeO_2$ phase of a fluorite-type structure finely
(Continued)

dispersed as crystal grains having an average particle diameter of equal to or smaller than 3 μm.

6 Claims, 5 Drawing Sheets

(51) Int. Cl.
    *H01J 37/34*     (2006.01)
    *C23C 14/34*     (2006.01)
    *H01L 33/42*     (2010.01)
    *H01L 31/0224*     (2006.01)
    *H01J 1/00*     (2006.01)

(52) U.S. Cl.
    CPC ............... *H01B 1/08* (2013.01); *H01J 1/00* (2013.01); *H01L 31/022466* (2013.01); *H01L 33/42* (2013.01)

(56) References Cited

U.S. PATENT DOCUMENTS

| | | |
|---|---|---|
| 2004/0231981 A1 | 11/2004 | Takahashi et al. |
| 2007/0209928 A1 | 9/2007 | Inoue et al. |
| 2009/0250683 A1 | 10/2009 | Totani et al. |
| 2012/0175570 A1 | 7/2012 | Nakayama et al. |
| 2012/0315439 A1 | 12/2012 | Nakayama |

FOREIGN PATENT DOCUMENTS

| | | |
|---|---|---|
| JP | 2004-149883 A | 5/2004 |
| JP | 2005-242264 A | 9/2005 |
| JP | 2005-290458 A | 10/2005 |
| JP | 2005-320192 A | 11/2005 |
| JP | 2007-055841 A | 3/2007 |
| JP | 2008-308385 A | 12/2008 |
| KR | 2007-0018032 A | 2/2007 |

OTHER PUBLICATIONS

Sawada, Y., "Developments of Transparent Conductive Films", CMC, published on Mar. 1, 1999, pp. 117-125.
International Search Report of PCT/JP2010/062817, mailing date Nov. 2, 2010, 4 pages, (with English translation).
Extended European Search Report dated Jan. 2, 2013, issued in corresponding European Patent Application No. 10806387.6 (3 pages).
Extended European Search Report dated Dec. 18, 2015, issued in counterpart European Patent Application No. 15001626.9 (7 pages).

* cited by examiner

OXIDE SINTERED BODY, PRODUCTION METHOD THEREFOR, TARGET, AND TRANSPARENT CONDUCTIVE FILM

CROSS-REFERENCE TO RELATED APPLICATIONS

This is a divisional application of U.S. patent application Ser. No. 13/388,887, filed on Mar. 29, 2012, now U.S. Pat. No. 9,028,721, which is a 371 of International Application No. PCT/JP2010/062817, filed on Jul. 29, 2010, which claims the benefit of priority from the prior Japanese Patent Application No. 2009-182761 filed on Aug. 5, 2009, the entire contents of which are incorporated herein by reference.

TECHNICAL FIELD

The present invention relates to an oxide sintered body and a production method therefor, a target, and a transparent conductive film, and in more detail, the present invention relates to a target for sputtering which enables to attain high rate film-formation of a transparent conductive film suitable for a blue LED or a solar cell, and a noduleless film-formation, an oxide sintered body most suitable for obtaining the same, and a production method thereof.

BACKGROUND ART

A transparent conductive film, because of having high conductivity and high transmittance in a visible light region, has been utilized in an electrode or the like, for a solar cell or a liquid crystal display element, and other various light receiving elements, as well as a heat ray reflection film for an automotive window or construction use, an antistatic film, and a transparent heat generator for various anti-fogging for a refrigerator showcase and the like.

As a well known practical transparent conductive film, there has been included a thin film of tin oxide ($SnO_2$)-type, zinc oxide (ZnO)-type, indium oxide ($In_2O_3$)-type. As the tin oxide-type, the one containing antimony as a dopant (ATO), or the one containing fluorine as a dopant (FTO) has been utilized, and as the zinc oxide-type, the one containing aluminum as a dopant (AZO), or the one containing gallium as a dopant (GZO) has been utilized. However, the transparent conductive film most widely used industrially is the indium oxide-type. Among them, indium oxide containing tin as a dopant is called an ITO (Indium-Tin-Oxide) film, and has been utilized widely, because, in particular, a film with low resistance can be obtained easily.

The transparent conductive film with low resistance is suitably used widely in a surface element or a touch panel or the like, of such as for a solar cell, a liquid crystal, an organic electroluminescence and an inorganic electroluminescence. As a production method for these transparent conductive films, a sputtering method or an ion plating method has been used often. This sputtering method is an effective method in film-formation of a material with low vapor pressure, or when control of precise film thickness is required, and because of very simple and easy operation thereof, it has been widely used industrially.

In a sputtering method, a target for sputtering is used as a raw material of a thin film. The target is a solid containing a metal element constituting the thin film to be formed, and a sintered body such as a metal, a metal oxide, a metal nitride, a metal carbide, or, in certain cases, a single crystal is used. In this method, in general, after making high vacuum once with a vacuuming apparatus, rare gas (argon or the like) is introduced, and under a gas pressure of equal to or lower than about 10 Pa, a substrate is set as an anode and a target is set as a cathode to generate glow discharge between them and generate argon plasma, and argon cations in the plasma are collided with the target of the cathode, and particles of the target component flicked thereby are deposited on the substrate to form a film.

A sputtering method is classified by a generation method of argon plasma, and a method using high frequency plasma is called a high frequency sputtering method, and a method using direct-current plasma is called a direct-current sputtering method.

In general, a direct-current sputtering method has been utilized industrially in a wide range, because it provides higher film-formation rate and lower cost of power source facility and simpler film-formation operation, as compared with the high frequency sputtering method. However, the direct-current sputtering method has a disadvantage of requiring use of a conductive target, as compared with the high frequency sputtering method, which can provide film-formation even by using an insulating target.

Film-formation rate of a sputtering has close relation to chemical bond of a target substance. Because a sputtering is a phenomenon that argon cations having a kinetic energy are collided to the target surface, and a substance of a target surface is flicked by receiving energy, the weaker inter-ionic bond or inter-atomic bond of the target substance increases the more probability of jumping out by sputtering.

In film-formation of a transparent conductive film of an oxide such as ITO by using a sputtering method, there are a method for film-formation of an oxide film by a reactive sputtering method in mixed gas of argon and oxygen, by using an alloy target (an In—Sn alloy in the case of the ITO film) of metals constituting the film, and a method for film-formation of an oxide film by a reactive sputtering method for performing a sputtering in mixed gas of argon and oxygen, by using an oxide sintered body target (an In—Sn—O sintered body in the case of the ITO film) composed of an oxide of metal constituting the film.

Among these, in a method for using the alloy target, relatively high amount of oxygen gas is supplied during sputtering, however, because dependence of film-formation rate or film characteristics (specific resistance, transmittance) on amount of oxygen gas to be introduced during film-formation is extremely high, it is difficult to produce stably a transparent conductive film having a constant film thickness or characteristics.

On the other hand, a method for using the metal oxide target supplies a part of oxygen supplied to the film from the target by sputtering, and thus residual deficient oxygen amount is supplied as oxygen gas, and dependence of characteristics (specific resistance, transmittance or the like) of the film on film-formation rate or oxygen gas amount to be introduced during film-formation is smaller than the case of using the alloy target, and because the transparent conductive film having constant film thickness and characteristics can be produced stably, a method for using the oxide target has been adopted industrially.

From such a background, in the case of mass production of the transparent conductive film by film-formation using the sputtering method, the direct-current sputtering method using the metal oxide target has been mainly adopted. Here, in consideration of productivity or production cost, characteristics of the oxide target during direct-current sputtering become important. That is, such an oxide target is useful that provides higher film-formation rate in the case of charging the same power. Still more, because film-formation rate becomes the higher, when the higher direct-current sputtering is charged, such an oxide target becomes useful industrially that is capable of film-forming stably without generation of target cracking or abnormal discharge caused by arcing due to nodule generation, even when high direct-current power is charged.

Here, the nodule means a black precipitate (protruded substance) generating at an erosion part of the target surface (meaning a site of the target being sputtered), excluding a very small part at the deepest part of erosion, when sputtering of the target proceeds. In general, the nodule is said not to be a deposition of a foreign flying substance or a reaction product at the surface, but a digging residue by sputtering. The nodule causes abnormal discharge such as arcing, and it has been known that arcing is suppressed by reducing the nodule (refer to NON-PATENT LITERATURE 1). Therefore, for performing stable film-formation, use of such an oxide target is necessary that does not generate the nodule, that is, a digging residue by sputtering.

On the other hand, the ion plating method is a method for evaporating a metal or a metal oxide by resistance heating or electron-beam heating, under a pressure of about $10^{-3}$ to $10^{-2}$ Pa, and still more activating the evaporated substance using plasma and reaction gas (oxygen) to deposit it on a substrate. Also as for the target for ion plating (it may also be called a tablet of pellet) to be used in forming the transparent conductive film, similarly as in the target for sputtering, use of an oxide tablet enables to more stably produce a transparent conductive film having constant film thickness and constant characteristics. The oxide tablet is required to evaporate uniformly, and it is preferable that a substance having stable chemical bond and difficult to be evaporated is not present together with a substance which is present as a main phase and easily evaporated.

As described above, it can be said that in order to form the transparent conductive film of an oxide such as ITO by the direct-current sputtering method or the ion plating method, such an oxide target is important that enables stable film-formation without generation of abnormal discharge caused by arcing or the like due to nodule generation.

By the way, many of the transparent conductive films such as ITO film, formed by the above process, are n-type degenerated semiconductors, and largely contribute to enhance conductivity of electrons of carriers. Therefore, conventionally, in order to make low resistance of the ITO film, carrier electron concentration has been made to increase as high as possible.

The ITO film has been known to have a crystallization temperature of generally about 190 to 200° C., and bordering on this temperature, an amorphous film or a crystalline film is formed. For example, in the case of film-formation by a sputtering method while maintaining the substrate at room temperature, the amorphous film is obtained, because thermal energy required in crystallization cannot be given. On the other hand, in the case where a substrate temperature is equal to or higher than crystallization temperature, for example, about 300° C., the crystalline film is formed.

In the amorphous film and the crystalline film of ITO, generation mechanism of carrier electrons is different. In general, in the case of the amorphous film, nearly all of the carrier electrons are generated by oxygen deficiency. On the other hand, in the case of the crystalline film, generation of the carrier electrons is expected by not only oxygen deficiency but also tin doping effect.

Indium oxide takes a crystal structure called bixbyite of a stable cubic system crystal phase, under normal pressure or pressure lower than that. By substitution of a lattice point of tri-valent indium in the bixbyite structure with tetra-valent tin, the carrier electrons are generated. Tin is an element which is capable of increasing carrier electron concentration most, as a dopant, and it has been known that the addition of 10% by weight as converted to tin oxide is capable of making low resistance most. That is, by converting the ITO film to a crystalline film, carrier electrons are generated in a large quantity by both of oxygen deficiency and the tin dopant, and therefore it is possible to form a film showing lower electric resistance as compared with an amorphous film having only oxygen deficiency.

However, in an LED (light Emitting Diode) or a solar cell whose progress has been significant in recent years, there has emerged a case requiring characteristics which is difficult to attain by ITO. As one example thereof, in a blue LED, to enhance light extraction efficiency, high refractive index of the transparent conductive film has been necessary for blue light at the vicinity of a wavelength of 460 nm. As a light emitting layer of the blue LED, a gallium nitride layer is used. As an optical characteristics of the gallium nitride layer, refractive index as high as about 2.4 is included. In order to enhance efficiency of light extraction from the light emitting layer, it is necessary to enhance consistency of refractive indexes of the transparent conductive film and the gallium nitride layer, and the transparent conductive film is required to have a refractive index of as near as 2.4. Refractive index is a value specific to a substance, and generally known refractive index of indium oxide is as low as 1.9 to 2.0. In addition, the transparent conductive film is required to have low surface resistance. It is because current diffusion is not sufficient in a film surface direction, as electrical characteristics of the gallium nitride layer. However, when it is tried to decrease electric resistance by increasing carrier electron concentration, refractive index of the indium oxide-type transparent conductive film becomes lowered further than 1.9 to 2.0 to 1.8 to 1.9. As described above, because the ITO film is a material having significantly increased carrier electron concentration owing to tin as a dopant, trying to obtain a crystalline film with such a low resistance results in decreasing refractive index, and this has been a problem to be solved.

In addition, other than refractive index or specific resistance, characteristics such as patterning property by wet etching or the like, superior than that of the ITO film, is required. Also in the above blue LED, such a process is preferable that makes low resistance by performing patterning by wet etching using a weak acid on the amorphous transparent conductive film formed at low temperature, and then by heat treatment under non-oxidative atmosphere to crystallize the amorphous transparent conductive film. By using this process, it is possible to form a transparent electrode having highly fine patterning.

As other application examples of the transparent conductive film, there is a solar cell. In the case of using it as a surface electrode of a solar cell, when the transparent conductive film has high transmittance of not only visible light but also infrared light, solar light can be taken in efficiently. The ITO film is capable of decreasing specific resistance, however, because of high carrier electron concentration, there was a problem of high reflectance or absorption of infrared light, and thus decreasing transmittance.

In addition, in the case of using it as a part of a rear surface electrode, there may be the case of using a transparent conductive film having enhanced refractive index, for performing adjustment of refractive index of the whole module, aiming at enhancing incorporation efficiency of solar light, however, also in this case, the ITO film was insufficient because of the same reason as in a blue LED application. However, in a solar cell application, it is not required such high-definition patterning by wet etching using a weak acid, that is required in the blue LED.

As one method for enhancing refractive index of the indium oxide-type transparent conductive film, there is a method for adding an oxide having high refractive index.

In PATENT LITERATURE 1, there has been described a sputtering target, which is capable of efficiently forming a transparent thin film with superior moisture-proof property, on a silver-type thin film by a sputtering method, and gives little damage to the above silver-type thin film, and there has been proposed a sputtering target composed of a conductive transparent metal oxide containing an oxide of a metal element substantially not having a solid solution region with silver, wherein content ratio of the above metal substantially not having a solid solution region with silver, is 5 to 40% by atom relative to the metal element of the conductive transparent metal oxide. Specifically, it has been described that containing of at least a titanium element or a cerium element is preferable, as the metal element substantially not having a solid solution region with silver, and as a metal element similarly applicable, there has been included a zirconium element, a hafnium element, a tantalum element. In addition, there has been described that indium oxide is preferable as the conductive transparent metal oxide.

In addition, in PATENT LITERATURE 1, there has been described that because the metal oxide of the titanium element or the cerium element, which is the metal element substantially not having a solid solution region with silver, has a high refractive index of equal to or higher than 2.3, and as said high refractive index material, total content rate of the titanium element and the cerium element is 5 to 40% by atom relative to the metal element of the conductive transparent metal oxide, it is possible to increase refractive index of the transparent conductive film, formed by using this sputtering target, up to about 2.1 to 2.3.

In addition, in PATENT LITERATURE 2, there has been proposed a sputtering target of a sintered body of a mixed oxide applicable in film-forming a transparent thin film of a conductive film with a composition sandwiching the silver-type thin film. In film-formation of the transparent thin film of the conductive film with a configuration sandwiching the silver-type thin film, in order to be able to effectively perform film-formation of the transparent thin film with superior moisture-proof property, and also to obtain a sputtering target where the above silver-type thin film little receives damage in this film-formation, specifically, a sintered body of the mixed oxide having contained tin oxide and/or titanium oxide in an amount lower than mixing ratio of each substrate, to a mixed oxide having indium oxide and cerium oxide as the substrate, is used. That is, similarly as in PATENT LITERATURE 1, because cerium oxide has high refractive index, also refractive index of the mixed oxide of indium oxide and cerium oxide becomes high, accompanying with addition ratio of cerium oxide.

Still more, because in the mixed oxide of indium oxide and cerium oxide, cerium oxide does not have sufficient conductivity, conductivity of a target using a sintered body of the mixed oxide abruptly decreases accompanying with increase in mixing ratio of cerium oxide, and thus providing a target with low conductivity, which makes difficult film-formation by a direct-current sputtering method.

As described above, according to PATENT LITERATUREs 1 and 2, it is expected to increase refractive index of the transparent thin film, formed by using this sputtering target, up to about 2.1 to 2.3, because efficient formation of the transparent thin film with superior moisture-proof property is possible by a sputtering method on the silver-type thin film, or because a metal oxide of a titanium element or a cerium element has a high refractive index of equal to or higher than 2.3. However, as described above, in the case of mass production of the transparent conductive film by film-formation using a direct-current sputtering method, in view of industrial usefulness of such an oxide target that is capable of stable film-formation without generation of target cracking or abnormal discharge caused by arcing due to nodule generation, even when high direct-current power is charged, it is necessary that nodule generation causing the above arcing is suppressed, or splash in an ion plating method is suppressed, when condition to increase film-formation rate, by increasing sputtering voltage or the like, is selected, but investigation on a texture or the like of the oxide sintered body enabling it has not been performed at all.

That is, there has not been considered to the point of industrially required characteristics, relating to the oxide sintered body to obtain a target applicable to stable film-formation of the above transparent conductive film.

Still more, in PATENT LITERATUREs 1 and 2, although there has been investigated a method for production a sintered body to obtain a target, or a method for enhancing conductivity, by the simple addition of tin oxide or titanium oxide, there has not been investigated at all a method for enhancing density of a sintered body by detailed analysis and control of a texture of the oxide sintered body containing indium and cerium as oxides; or a method for avoiding arcing in film-formation using the above sputtering method, or splash in film-formation using the ion plating method. In addition, as for the case where a crystalline transparent conductive film was formed, there has not been investigated at all influence of tin oxide or titanium oxide, which is the addition element, on refractive index of the transparent conductive film.

On the other hand, in PATENT LITERATURE 3, there has been proposed an amorphous transparent conductive thin film which is extremely smooth and has a high work function, an oxide sintered body which is capable of forming stably said transparent conductive thin film, and a sputtering target using the same, and there has been described that it is desirable that said oxide sintered body contains 3% by mass to 20% by mass of cerium, 0.1% by mass to 4% by mass of tin, and 0.1% by mass to 0.6% by mass of titanium, and the remaining is substantially composed of indium and oxygen, and still more cerium, tin and titanium make a solid solution in an indium site, sintering density is equal to or higher than 7.0 g/cm$^3$, and average crystal grain diameter is equal to or smaller than 3 μm.

Also in this PATENT LITERATURE 3, there has not been investigated at all enhancement of refractive index of the crystalline transparent conductive film formed by using said sputtering target. In particular, there has not been referred at all to influence of tin on decrease in refractive index.

Still more, as for said oxide sintered body, average particle diameter of a crystal grain of indium oxide, where cerium, tin and titanium make a solid solution in an indium site, is controlled at equal to or smaller than 3 μm, aiming at suppressing sintering crack during sputtering and nodule generation at that part, however, there has not been investigated at all a problem that cerium does not make a solid solution in indium oxide, and is present as crystal grains of cerium oxide, which becomes a starting point of a nodule.

In addition, in PATENT LITERATURE 4, there has been described a sputtering target characterized in that, in a sputtering target composed of indium oxide and cerium oxide, in the case of observing crystal peaks using X-ray diffraction, presence of peaks derived from indium oxide and cerium oxide are observed, and in performing EPMA measurement, diameter of a cerium oxide particle dispersed in indium oxide is found to be equal to or smaller than 5 μm.

This PATENT LITERATURE 4 is a sputtering target composed of indium oxide and cerium oxide, and has not investigated at all enhancement of refractive index and decrease in resistance of a crystalline transparent conductive film formed by using said sputtering target composed of indium oxide and cerium oxide, and not added with titanium or the like. In particular, there has not been referred at all to influence of tin on decreasing refractive index.

As described above, in conventional technology relating to an oxide sintered body containing indium and cerium having low specific resistance and high refractive index, sufficient investigation has not been performed on nodule suppression in sputtering film-formation, or splash prevention or the like in ion plating film-formation, which becomes important in view of mass production of a crystalline transparent conductive film, and it has been desired emergence of an oxide sintered body containing indium and cerium, which has solved these problems.

CITATION LIST

Patent Literature

PATENT LITERATURE 1: JP-A-8-260134
PATENT LITERATURE 2: JP-A-9-176841
PATENT LITERATURE 3: JP-A-2005-320192
PATENT LITERATURE 4: JP-A-2005-290458

Non-Patent Literature

NON-PATENT LITERATURE 1: "Technology of a transparent conductive film (the second Revised version)", Ohmsha, Ltd., published on Dec. 20, 2006, pages 238 to 239
NON-PATENT LITERATURE 2: "New development of a transparent conductive film", CMC, published on Mar. 1, 1999, pages 117 to 125

SUMMARY OF INVENTION

Technical Problem

It is an object of the present invention to provide the target for sputtering which is capable of attaining high film-formation rate of the crystalline transparent conductive film having low specific resistance and high refractive index, along with noduleless in sputtering film-formation, the oxide sintered body most suitable for obtaining it, and the production method therefor.

Solution to Problem

The present inventors have studied in detail on influence of a compositional phase and a texture of the oxide sintered body on production conditions such as film-formation rate thereof and the like, or nodule generation causing arcing, by preparing many oxide sintered body samples by changing the compositional phase and the texture of the oxide sintered body containing oxides of indium and tin as main components, and still more an oxide of such as titanium or the like, and forming the oxide transparent conductive film by a sputtering method, using this as a raw material.

As a result, we have discovered that nodule generation causing arcing can be suppressed more, as compared with conventional cases, even in the case of enhancing film-formation rate by increasing charged power in forming the above transparent conductive film on a substrate, by (1) setting cerium content at 0.3 to 9% by atom, as an atomicity ratio of Ce/(In+Ce+M), the content of the M element at equal to or lower than 1% by atom, as an atomicity ratio of M/(In+Ce+M), and total content of cerium and the M element at equal to or lower than 9% by atom, as an atomicity ratio of (Ce+M)/(In+Ce+M), in the oxide sintered body containing indium and cerium and still more at least one or more kinds of an metal element (M element) selected from the metal element group consisting of titanium, zirconium, hafnium, molybdenum and tungsten, as an oxide, as well as (2) by composing the above oxide sintered body with substantially an $In_2O_3$ phase of a bixbyite structure and a $CeO_2$ phase of a fluorite-type structure, and controlling the average particle diameter of crystal grains composed of a $CeO_2$ phase, dispersing in the $In_2O_3$ phase, at equal to or smaller than 3 μm, and as a result, the crystalline transparent conductive film having low specific resistance and high refractive index can be obtained efficiently and stably, and have thus completed the present invention.

That is, according to a first aspect of the present invention, there is provided a oxide sintered body comprising an indium oxide and a cerium oxide, and further comprising, as an oxide, at least one or more kinds of an metal element (M element) selected from the metal element group consisting of titanium, zirconium, hafnium, molybdenum and tungsten, wherein the cerium content is 0.3 to 9% by atom, as an atomicity ratio of Ce/(In+Ce+M), the M element content is equal to or lower than 1% by atom, as an atomicity ratio of M/(In+Ce+M), and the total content of cerium and the M element is equal to or lower than 9% by atom, as an atomicity ratio of (Ce+M)/(In+Ce+M), characterized in that: said oxide sintered body has an $In_2O_3$ phase of a bixbyite structure as a main crystal phase, has a $CeO_2$ phase of a fluorite-type structure finely dispersed as crystal grains having an average particle diameter of equal to or smaller than 3 μm, as a second phase In addition, according to a second aspect of the present invention, there is provided the oxide sintered body, characterized in that, in the first aspect, X-ray diffraction peak intensity ratio (I), defined by the following formula, is equal to or lower than 25%:

$$I = [CeO_2 phase(111)/In_2O_3 phase(222)] \times 100 [\%]$$

In addition, according to a third aspect of the present invention, there is provided the oxide sintered body according to claim 1, characterized in that, in the first aspect, the M element is titanium.

In addition, according to a fourth aspect of the present invention, there is provided the oxide sintered body, characterized by, in the first aspect, not comprising tin In addition, according to a fifth aspect of the present invention, there is provided a production method for a oxide sintered body obtained by adding and mixing oxide powder of at least one or more kinds of an M element selected from the M metal element group consisting of titanium, zirconium, hafnium, molybdenum and tungsten, to raw material powder comprising indium oxide powder and cerium oxide powder, and then molding the mixed powder, and sintering the molding by a normal pressure sintering method, or molding and sintering the mixed powder by a hot press method, characterized in that average particle diameter of the raw material powder is adjusted to equal to or smaller than 1.5 μm, the oxide powder is mixed to said raw material powder, then molded, and the resultant molding is sintered, so that the oxide sintered body after sintering has an $In_2O_3$ phase of a bixbyite-type structure, as a main crystal phase, has a $CeO_2$ phase of a fluorite-type structure finely dispersed as crystal grains having an average particle diameter of equal to or smaller than 3 μm, as a second phase.

In addition, according to a sixth aspect of the present invention, there is provided the production method for the oxide sintered body, characterized in that, in the fifth aspect, the oxide sintered body for a target to be used in forming a transparent conductive film by a sputtering method is obtained by sintering the molding by a normal pressure sintering method, under atmosphere containing oxygen gas, at a sintering temperature of 1250 to 1650° C., for a sintering time of 10 to 30 hours.

In addition, according to a seventh aspect of the present invention, there is provided the production method for the oxide sintered body, characterized in that, in the fifth aspect, the oxide sintered body for a target to be used in forming a transparent conductive film by a sputtering method is obtained by molding and sintering the mixed powder by a hot press method, at a temperature of 700 to 950° C. for 1 to 10 hours, under a pressure of 2.45 to 29.40 MPa, under inert gas atmosphere or in vacuum.

On the other hand, according to an eighth aspect of the present invention, there is provided a target for sputtering obtained by fabricating the oxide sintered body in any of the first to the fourth aspects wherein density of the oxide sintered body is equal to or higher than 6.3 g/cm$^3$.

Still more, according to a ninth aspect of the present invention, there is provided, a transparent conductive film characterized by being formed on a substrate by a sputtering method, using the target of the eighth aspect of the present invention.

Advantageous Effects of Invention

Because the oxide sintered body containing indium and cerium, still more containing at least one or more kinds of an metal element (M element) selected from the metal element group consisting of titanium, zirconium, hafnium, molybdenum and tungsten, of the present invention, has the cerium content of 0.3 to 9% by atom, as an atomicity ratio of Ce/(In+Ce+M), the M element content of equal to or lower than 1% by atom, as an atomicity ratio of M/(In+Ce+M), and the total content of cerium and the M element of equal to or lower than 9% by atom, as an atomicity ratio of (Ce+M)/(In+Ce+M), and contains the $In_2O_3$ phase of a bixbyite-type structure, as a main crystal phase, and the $CeO_2$ phase of a fluorite-type structure, as a second phase, is finely dispersed as crystal grains with an average particle diameter of equal to or smaller than 3 μm, nodule generation causing arcing can be suppressed, even in increased film-formation rate, in obtaining an oxide transparent conductive film using said oxide sintered body by a sputtering method. Thereby, it is possible to shift to film-formation condition with increased film-formation rate, and mass production of the transparent conductive film is possible. As a result, the crystalline transparent conductive film having low specific resistance and high refractive index, containing indium and cerium, and at least one or more kinds of the metal element (M element) selected from the metal element group consisting of titanium, zirconium, hafnium, molybdenum and tungsten, can be obtained efficiently, which is extremely useful industrially.

DESCRIPTION OF EMBODIMENTS

Figure 1:
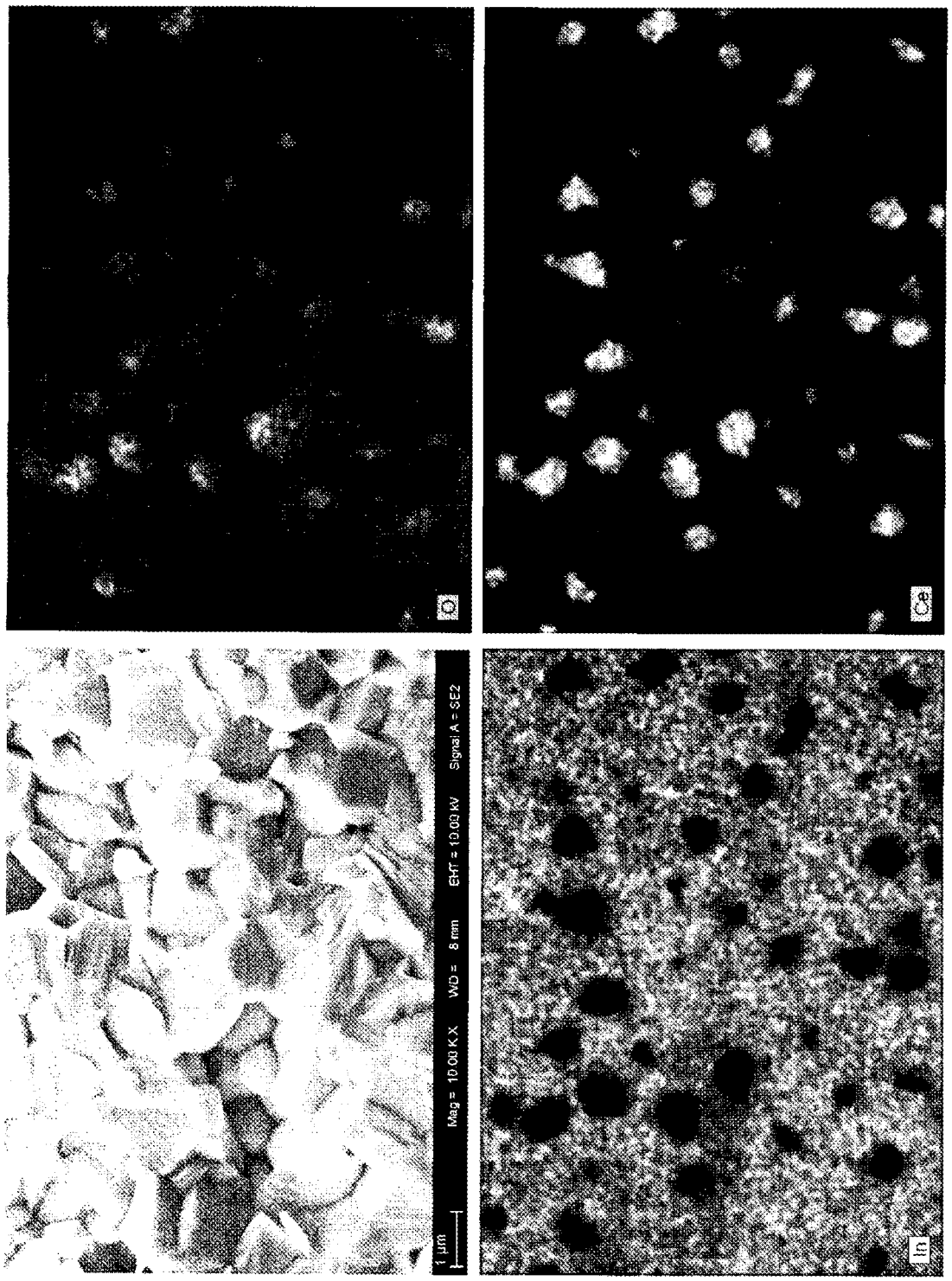
FIG. 1 is a photo showing a secondary electron image by a scanning electron microscope (SEM), and surface analysis result by an energy dispersive X-ray analysis method (EDS) of the cross-section of an oxide sintered body containing cerium in a content of 9% by atom, as an atomicity ratio of Ce/(In+Ce), as an example of an $In_2O_3$ phase of a main crystal phase, wherein a crystal grain of a $CeO_2$ phase is finely dispersed.

Explanation will be given below in detail on the oxide sintered body, the production method therefor, the target and the transparent conductive film, of the present invention, with reference to drawings.

1. An Oxide Sintered Body

In the present invention, it is preferable that the oxide sintered body containing the indium oxide and the cerium oxide, further the oxide of at least one or more kinds of the metal element (M element) selected from the metal element group consisting of titanium, zirconium, hafnium, molybdenum and tungsten, has a specific phase structure, wherein the cerium content is 0.3 to 9% by atom, as an atomicity ratio of Ce/(In+Ce+M), the M element content is equal to or lower than 1% by atom, as an atomicity ratio of M/(In+Ce+M), and the total content of cerium and M element is equal to or lower than 9% by atom, as an atomicity ratio of (Ce+M)/(In+Ce+M), and the M element is particularly preferably titanium.

As described above, conventionally, a target for sputtering aiming at forming a transparent conductive film composed of oxides containing indium and cerium has been proposed, however, because there has not been investigated sufficiently, as for the oxide sintered body containing indium and cerium to be a material thereof, on optimization of the compositional phase and the texture, or the like, of said oxide sintered body, nodule generation at the target surface causing arcing cannot be suppressed, and thus it was impossible to produce the transparent conductive film in high rate. In the present invention, the oxide sintered body containing indium and cerium has been investigated in detail, in view of the compositional phase and the texture thereof, to clarify influence on film-formation rate of the oxide transparent conductive film, or on nodule generation at the target surface causing arcing in film-formation.

The oxide sintered body of the present invention contains the indium oxide and the cerium oxide, and still more at least one or more kinds of the metal element (M element) selected from the metal element group consisting of titanium, zirconium, hafnium, molybdenum and tungsten, as an oxide, wherein the cerium content is 0.3 to 9% by atom, as an atomicity ratio of Ce/(In+Ce+M), the M element content is equal to or lower than 1% by atom, as an atomicity ratio of M/(In+Ce+M), and the total content of cerium and the M element is equal to or lower than 9% by atom, as an atomicity ratio of (Ce+M)/(In+Ce+M), and the $In_2O_3$ phase of a bixbyite-type structure is a main crystal phase, and, as a second phase, a $CeO_2$ phase of a fluorite-type structure is finely dispersed as crystal grains having an average particle diameter of equal to or smaller than 3 μm.

(a) Composition

As for the oxide sintered body of the present invention, it is necessary that the cerium content is 0.3 to 9% by atom, as an atomicity ratio of Ce/(In+Ce+M), the M element content is equal to or lower than 1% by atom, as an atomicity ratio of M/(In+Ce+M), and the total content of cerium and the M element is equal to or lower than 9% by atom, as an atomicity ratio of (Ce+M)/(In+Ce+M), so that the crystalline transparent conductive film having low specific resistance and high refractive index is obtained, by a sputtering method.

In the case where the cerium content of the oxide sintered body is below 0.3% by atom, as an atomicity ratio of Ce/(In+Ce+M), carrier electrons minimum required are not generated in the transparent conductive film formed using this as a raw material, and is thus not preferable. For the transparent conductive film formed using the oxide sintered body as a raw material to show low specific resistance due to high mobility, it is necessary to generate a small amount of carrier electrons by doping of cerium, in addition to carrier electrons generated by oxygen deficiency.

On the other hand, in the case where cerium content of the oxide sintered body is over 9% by atom, as an atomicity ratio of Ce/(In+Ce+M), ratio of the $CeO_2$ phase of a fluorite-type structure dispersed in the oxide sintered body results in being increased, and the CeO2 phase becomes to have higher electric resistance and lower film-formation rate, as compared with the $In_2O_3$ phase, and thus production efficiency decreases industrially. In addition, the excess addition of Ce increases specific resistance of the crystalline transparent conductive film formed, and makes it difficult to obtain equal to or lower than $8\times10^{-4}$ Ω·cm minimum required in using as a transparent electrode of a blue LED or a solar cell.

Reason for making contain at least one or more kinds of the M metal element selected from the metal element group consisting of titanium, zirconium, hafnium, molybdenum and tungsten, as an oxide of the M element, into the transparent conductive film containing indium and cerium, is to generate carrier electrons stably. As described above, cerium is possible to generate carrier electrons, however, because generation effect thereof is very small, which inhibits stable generation, which may result in the case where amount of carrier electrons minimal required cannot be obtained. On the other hand, when M element content is equal to or lower than 1% by atom, as an atomicity ratio relative to total metal elements M element, generation effect of carrier electrons becomes several times high, as compared with cerium, and carrier electrons can be obtained stably, and thus amount of carrier electrons required can be generated by only a trance amount of the addition. It should be noted that, because it is necessary to decrease the addition amount of cerium to compensate the addition of the M element, effect of more decreasing specific resistance can be obtained, although refractive index decreases a little. This effect is valid also in a combination of two or more kinds of elements selected from the above element group.

In addition, because tin has far higher generation effect of carrier electrons, when added to indium oxide, tin should not be contained. It is not preferable to make contain also elements such as silicon, germanium, antimony, bismuth and tellurium and the like, by the same reason, although the above effect thereof is a little inferior, as compared with tin. However, as for unavoidable impurities of amounts which does not influence to the above characteristics, it does not apply.

(b) A Generated Phase and a Form Thereof

It is necessary that the oxide sintered body of the present invention should have not only the above composition rage, but also the texture thereof should have the $In_2O_3$ phase of a bixbyite structure, as a main crystal phase, and the $CeO_2$ phase of a fluorite-type structure should be finely dispersed, as a second phase, as crystal grains having an average particle diameter of equal to or smaller than 3 μm.

In the $In_2O_3$ phase of a bixbyite structure as the main phase, cerium seldom makes a solid solution. On the other hand, indium seldom makes a solid solution also in the $CeO_2$ phase of a fluorite-type structure of a dispersed phase. However, in the both phases, a part of indium may be substituted with cerium in a non-equilibrium way, or a part of cerium may be substituted with indium, or there may be contained some shifts from a stoichiometric composition, metal element deficiency or oxygen deficiency.

In the above PATENT LITERATURE 3, there has been described that cerium, tin and titanium make a solid solution in an indium site of the $In_2O_3$ phase which is the oxide sintered body. Originally, cerium seldom makes a solid solution in the $In_2O_3$ phase, however, in the case of the PATENT LITERATURE 3, it is estimated that cerium becomes easy to make a solid solution due to containing mainly tin. In addition, also in the above PATENT LITERATUREs 1 and 2, it is estimated that cerium became easy to make a solid solution similarly, because tin or titanium is containing in relatively high compositional ratio as compared with cerium, in most Examples. However, in the case of adding cerium in such a large quantity as over the composition range of the present invention, it does not apply, and for example, a mixed oxide containing any of In, Ce, Sn and Ti may be formed as an another phase.

In addition, as for the oxide sintered body of the present invention, as described above, it is necessary that relation between the $In_2O_3$ phase of a bixbyite-type structure as the main phase, where cerium seldom makes a solid solution, and the $CeO_2$ phase of a fluorite-type structure, as a second phase is expressed by an X-ray diffraction peak intensity ratio (I), defined by the following formula (1), and said X-ray diffraction peak intensity ratio is equal to or lower than 25%. In particular, it is preferable that the X-ray diffraction peak intensity ratio is equal to or lower than 20%. The X-ray diffraction peak intensity ratio over 25% generates arching frequently in sputtering, and is thus not preferable.

$$I=[CeO_2 phase(111)/In_2O_3 phase(222)]\times 100[\%] \quad (1)$$

It is necessary that the $CeO_2$ phase of a fluorite-type structure, as a second phase, is finely dispersed as crystal grains having an average particle diameter of equal to or smaller than 3 µm, and the average particle diameter of the crystal grain over 3 µm generates arcing frequently in sputtering, and is thus not preferable. It is more preferable that the average particle diameter of the crystal grain is equal to or smaller than 2 µm.

(c) a Sintered Body Texture and a Nodule

The oxide sintered body of the present invention has a sintered body texture which little generates a nodule in direct-current sputtering.

In the case where the oxide sintered body containing indium and cerium as oxides is processed, for example, as a target for direct-current sputtering, crystal grains of the $In_2O_3$ phase of a main phase and the $CeO_2$ phase as the second phase are present at said target surface, and there may be a case causing a problem of nodule generation in the target surface, depending on the crystal particle diameter or dispersing state of $CeO_2$ phase among them. The $CeO_2$ phase has such characteristics as electric resistance is higher as compare with the $In_2O_3$ phase, and is little sputtered. A general oxide sintered body of ITO is composed of crystal grains of a coarse $In_2O_3$ phase with an average particle diameter of about 10 µm, where Sn makes a solid solution, however, in the case where the oxide sintered body containing indium and cerium as oxides within the above composition range is composed of coarse crystal grains in both of the $In_2O_3$ phase and the $CeO_2$ phase, similarly as the ITO sintered body, the crystal grains of the $In_2O_3$ phase are sputtered preferentially, but sputtering of the crystal grains of the $CeO_2$ phase does not proceed, and thus coarse crystal grains of the $CeO_2$ phase remain at the target surface as a digging residue, resulting in gradual growth of the nodule starting from this digging residue, and frequent occurrence of abnormal discharge such as arcing or the like.

In order to suppress the nodule formed by the digging residue in this way, it is necessary to make a finer texture of the oxide sintered body containing indium and cerium, as an oxide, within the above composition range. That is, it is necessary to finely disperse the crystal grain of the $CeO_2$ phase in said oxide sintered body. Because the $CeO_2$ phase has conductivity in a reduced state, the $CeO_2$ phase itself never becomes a cause of abnormal discharge and is unlikely to become a starting point of nodule growth, due to being finely dispersed.

In FIG. 1, there are shown a secondary electron image by a scanning electron microscope (SEM), and surface analysis result by an energy dispersive X-ray analysis method (EDS) of the cross-section of the oxide sintered body containing cerium in a content of 9% by atom, as an atomicity ratio of Ce/(In+Ce), as a example of the $In_2O_3$ phase, as a main phase, finely dispersed with the crystal grain of the $CeO_2$ phase. Although not distinguishable in a secondary electron image at the upper left of the photo, in the surface analysis result of the lower right photo, the $In_2O_3$ phase as the main phase, and the $CeO_2$ phase as the second phase are clearly distinguished. This is considered that cerium little makes a solid solution in the $In_2O_3$ phase of a bixbyite structure, or indium little makes a solid solution also in the $CeO_2$ phase of a fluorite-type structure, which is a dispersed phase. Here, it has been confirmed that, in the crystal grain of the $CeO_2$ phase, there are many particles with an average particle diameter of equal to or smaller than 3 µm, particularly equal to or smaller than 1 µm, and use of a target obtained by processing of this oxide sintered body little generates a nodule from a digging residue as a starting point in sputtering.

In this way, as shown in FIG. 1, it is clear that a texture having the $In_2O_3$ phase as a main crystal phase, and the $CeO_2$ phase finely dispersed as a second phase, is effective in suppressing a nodule, which tends to be generated accompanying with progress of sputtering.

Figure 5:
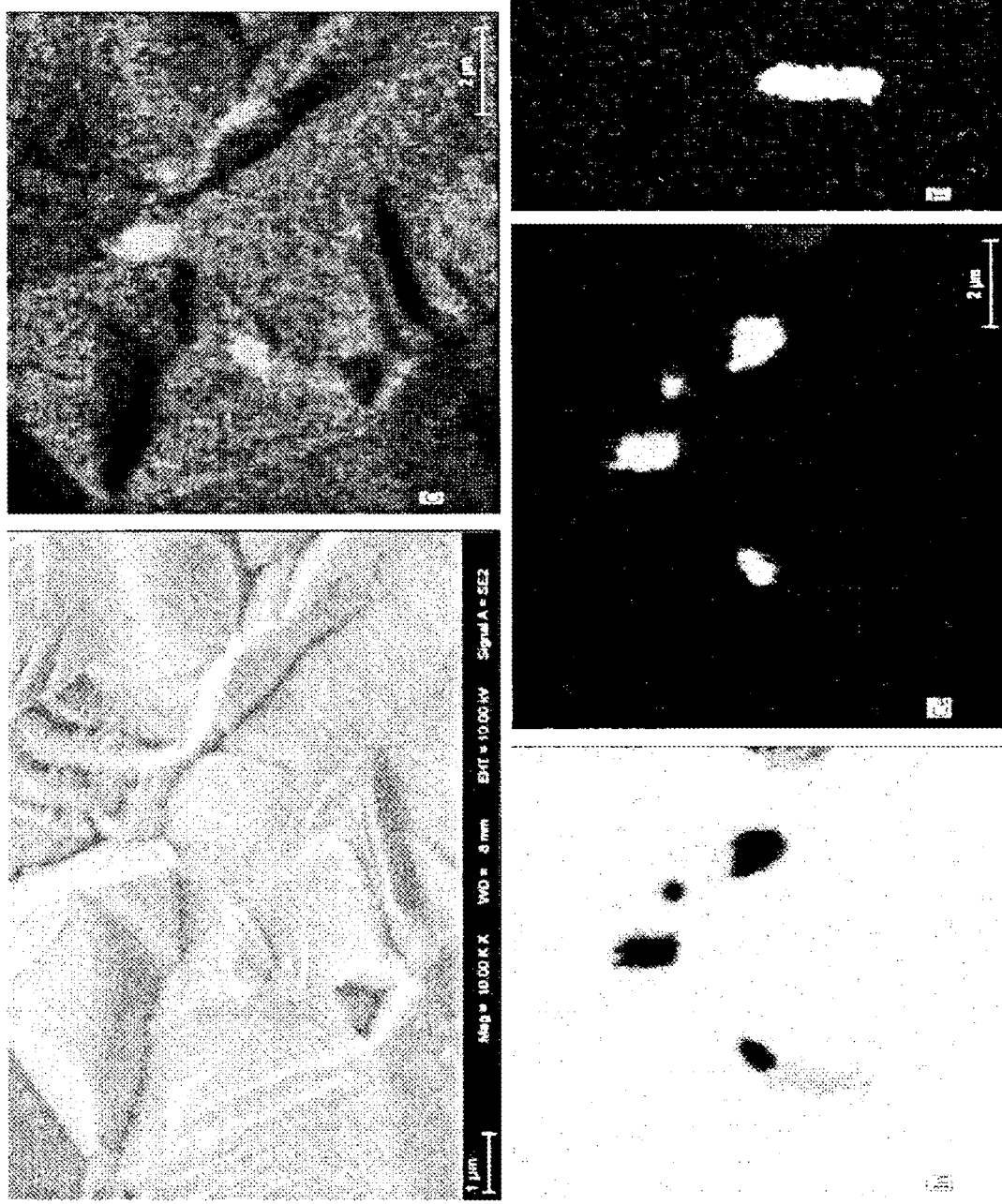
FIG. 5 is a photo showing a secondary electron image by a scanning electron microscope (SEM), and surface analysis result by an energy dispersive X-ray analysis method (EDS) of the cross-section of an oxide sintered body of Reference Example 3, containing cerium in a content of 4% by atom, as an atomicity ratio of Ce/(In+Ce+Ti) and containing titanium in a content is 1% by atom, as an atomicity ratio of Ti/(In+Ce+Ti), as an example of an $In_2O_3$ phase of a main crystal phase, wherein a crystal grain of a $CeO_2$ phase is finely dispersed.

In addition, in FIG. 5, there are shown a secondary electron image by a scanning electron microscope (SEM), and surface analysis result by an energy dispersive X-ray analysis method (EDS) of the cross-section of the oxide sintered body of Reference Example 3 having a cerium content of 4% by atom, as an atomicity ratio of Ce/(In+Ce), and a titanium content of 1% by atom, as an atomicity ratio of Ti/(In+Ce+Ti), as an example of crystal grains of the $CeO_2$ phase finely dispersed in the $In_2O_3$ phase of a main crystal phase. Although not distinguishable in a secondary electron image at the upper left of the photo, in the surface analysis result of the lower right photo, the $In_2O_3$ phase of the main phase, and the $CeO_2$ phase of the second phase are clearly distinguished. The reason is considered that cerium little makes a solid solution in the $In_2O_3$ phase of a bixbyite-type structure, or indium little makes a solid solution also in the $CeO_2$ phase of a fluorite-type structure, which is a dispersed phase. In addition, because an aspect of a co-presence state of indium and titanium in a part of the crystal grains is observed from the surface analysis result at the lower right photo, it is judged that Ti has a solid solution in the $In_2O_3$ phase of a main phase. Here, the crystal grain of the $CeO_2$ phase has many particles with an average particle diameter of equal to or smaller than 3 µm, and it has been confirmed that use of a target obtained by processing of this oxide sintered body little generates a nodule starting from a digging residue in sputtering. In this way, as shown in FIG. 5, it is clear that the texture having the $In_2O_3$ phase as a main crystal phase, finely dispersed with the $CeO_2$ phase as a second phase, is effective to suppress a nodule which tends to be generated accompanying with proceeding of sputtering.

As described above, in order to suppress a nodule, it is necessary that the average particle diameter of crystal grains composed of the $CeO_2$ phase is equal to or smaller than 3 µm, and still more it is preferable to be controlled at equal to or smaller than 2 µm. It should be noted that, in the case where the cerium content in the oxide sintered body is below 0.3% by atom, crystal grains of a fine $CeO_2$ phase become not to be dispersed uniformly, and the nodule suppression method of the present invention becomes not effective.

In this way, in the present invention, a dispersed state of the $CeO_2$ phase in the oxide sintered body is specified, as well as a composition ratio to the $In_2O_3$ phase is specified. The composition ratio of the $In_2O_3$ phase of a main crystal phase and the $CeO_2$ phase of a dispersed phase, in the oxide sintered body of the present invention, has the X-ray diffraction peak intensity ratio (I), defined by the above formula (1), of equal to or lower than 25%.

In addition, in the present invention, strength is enhanced by making finer crystal grains composing the oxide sintered body. That is, the oxide sintered body becomes the one difficult to fracture, even in receiving impact by heat or the like, by increasing power to be charged in sputtering.

It should be noted that any of at least one or more kinds of the M metal element selected from the metal element group consisting of titanium, zirconium, hafnium, molybdenum and tungsten preferentially makes a solid solution in the $In_2O_3$ phase, however, there may also be the case where it makes a solid solution also in the $CeO_2$ phase, when atomic ratio relative to total metal elements is over 1% by atom. Because the $CeO_2$ phase, where the M element made a solid solution, decreases conductivity, there may be the case where the $CeO_2$ phase itself becomes a cause of arcing in direct-current sputtering, or becomes a cause of arcing by generating a nodule as a digging residue, and is thus not preferable.

In the oxide sintered body of the present invention, most preferable one is the one where titanium only is selected in the M metal element group. That is, in the oxide sintered body containing, as an oxide, indium, cerium and titanium, such one is preferable that has the cerium content of 0.3 to 9% by atom, as an atomicity ratio of Ce/(In+Ce+Ti), the titanium content of equal to or lower than 1% by atom, as an atomicity ratio of Ti/(In+Ce+Ti), and the total content of cerium and titanium of equal to or lower than 9% by atom, as an atomicity ratio of (Ce+Ti)/(In+Ce+Ti)), where the $In_2O_2$ phase of a bixbyite-type structure is a main crystal phase, and the $CeO_2$ phase of a fluorite-type structure, as a second phase, and an oxide phase of the M element are finely dispersed, as crystal grains having an average particle diameter of equal to or smaller than 3 µm.

As described above, the case of the addition of only cerium to the indium oxide-type transparent conductive film does not necessarily generate carrier electrons stably. Therefore, in order to stably generate carrier electrons, it is effective to add both cerium and titanium, not adding only cerium. In addition, in such applications where low specific resistance has priority than high refractive index, it is preferable to generate relatively more carrier electrons in the crystalline transparent conductive film. In this case also, the addition of both cerium and the titanium is more effective than the addition of only cerium. Titanium has generation effect of carrier electrons several times high, as compared with cerium, and required amount of carrier electrons can be generated by only a trance amount of the addition. Because it is necessary to decrease the addition amount of cerium to compensate the addition of titanium, specific resistance can be decreased effectively, although refractive index decreases a little.

It should be noted that, as described above, because tin has far higher generation effect of carrier electrons, as compared with titanium, tin should not be contained. It is not preferable to contain also elements such as silicon, germanium, antimony, bismuth and tellurium and the like, by the same reason, although the above effect thereof is a little inferior, as compared with tin.

From the above reason, it is preferable that the cerium content is 0.3 to 9% by atom, as an atomicity ratio of Ce/(In+Ce+Ti), the Ti content is equal to or lower than 1% by atom, as an atomicity ratio of Ti/(In+Ce+Ti), and the total content of cerium and titanium is equal to or lower than 9% by atom, as an atomicity ratio of (Ce+Ti)/(In+Ce+Ti).

The Ti content over 1% by atom, as an atomicity ratio of Ti/(In+Ce+Ti), provides too high carrier electron concentration in the crystalline transparent conductive film, causing decrease in refractive index, and is thus not preferable rather. Still more, in the oxide sintered body, titanium preferentially makes a solid solution in the $In_2O_3$ phase, however, there may also be the case where it makes a solid solution in the $CeO_2$ phase, when the amount is over 1% by atom. The $CeO_2$ phase decreases conductivity, even in a reduced state, when titanium makes a solid solution, causing arcing. In addition, when total content of cerium and titanium is over 9% by atom, as an atomicity ratio of (Ce+Ti)/(In+Ce+Ti), because refractive index decreases similarly, mainly caused by increase in titanium content, and is thus not preferable.

2. The Production Method for the Oxide Sintered Body

In the production method for the oxide sintered body of the present invention, raw material powder containing indium oxide powder and cerium oxide powder is mixed, or further oxide powder of at least one or more kinds of the metal element selected from the M metal element group consisting of titanium, zirconium, hafnium, molybdenum and tungsten, preferably titanium oxide powder, is added and mixed, then the mixed powder is molded, and the molding is sintered by a normal pressure sintering method. Alternatively, the above mixed powder is molded by a hot press method and sintered.

The average particle diameter of the above raw material powder is set at equal to or smaller than 1.5 µm, and the oxide sintered body after sintering is subjected to heat treatment at temperature and for time sufficient to obtain the oxide sintered body, where the $In_2O_3$ phase of a bixbyite-type structure is a main crystal phase, and the $CeO_2$ phase of a fluorite-type structure is finely dispersed, as a second phase, as crystal grains having an average particle diameter of equal to or smaller than 3 µm. In this way, the oxide sintered body where the $In_2O_3$ phase of a bixbyite-type structure is a main crystal phase, and the $CeO_2$ phase of a fluorite-type structure is finely dispersed, as a second phase, as crystal grains having an average particle diameter of equal to or smaller than 3 µm, more preferably equal to or smaller than 2 µm, can be obtained.

That is, performance of the oxide sintered body, having the above phase composition and a composition of each phase, largely depends on production condition of the oxide sintered body, for example, particle diameter of raw material powder, mixing condition and firing condition.

The oxide sintered body of the present invention requires that the indium oxide powder and the cerium oxide powder adjusted to have an average particle diameter of equal to or smaller than 1.5 µm are used, as raw material powder, as well as oxide powder of at least one or more kinds of the M element selected from the M metal element group consisting of titanium, zirconium, hafnium, molybdenum and tungsten, particularly titanium oxide powder is used as raw material powder.

As described above, by setting the average particle diameter of raw material powder at equal to or smaller than 1.5 µm, it is possible to attain a texture of the oxide sintered body of the present invention, which has the $In_2O_3$ phase of a bixbyite-type structure, as a main phase, where the second phase composed of the $CeO_2$ phase of a fluorite-type structure is present, however, crystal grains composed of the $CeO_2$ phase are finely and uniformly dispersed relative to the main phase, and have an average particle diameter of equal to or smaller than 3 µm. Still more, by adjusting indium oxide powder and cerium oxide powder so as to have an average particle diameter of equal to or smaller than 1 µm, it is possible to control average particle diameter of the crystal grain composed of the second $CeO_2$ phase to equal to or smaller than 2 µm.

When the indium oxide powder or cerium oxide powder and titanium oxide powder with the average particle diameter over 1.5 µm is used as raw material powder, the average particle diameter of the crystal grains composed of the $CeO_2$ phase, which is present in the resultant oxide sintered body, along with the $In_2O_3$ phase as a main phase, becomes over 3 μm.

In NON-PATENT LITERATURE 2, there has been explained, as for sintering mechanism of ITO, that by increasing heating • temperature raising speed of an ITO molding more than certain speed in sintering, time for generation of neck growth and particle growth, by evaporation • condensation mechanism or surface diffusion mechanism, where making a finer texture little progresses, can be shortened, and a temperature region of volume diffusion can be reached in a state that driving force of sintering is still maintained, therefore making a finer texture is progressed and sintering density is enhanced. In this case, inter-particle distance "d" before sintering, which corresponds to particle diameter of raw material powder, contracts to "d'", by mass transfer caused by volume diffusion during a sintering process. In this way, when limited to sintering of two particles of raw material powder, diameter of the crystal grain of the sintered body becomes "2d'". However, usually, because a plurality of particles of the same kinds of the oxides are adjacent, it is considered that diameter of the crystal grain of the sintered body is over "2d'", finally.

In the case where cerium little makes a solid solution in indium oxide, as in the present invention, it is important to decrease particle diameter of cerium oxide raw material powder, to decrease crystal grain diameter of the cerium oxide phase of the sintered body.

As described above, large crystal grains of the $CeO_2$ phase with the average particle diameter over 3 μm tend not to be sputtered and to become a digging residue. Therefore, in the case of continued sputtering, it makes a comparative large residue on the surface of target, and it makes the origin of nodule to cause the abnormal discharge such as arcing.

Indium oxide powder is a raw material of ITO (indium-tin oxide), and development of fine indium oxide powder, having excellent sintering property, has been promoted with improvement of ITO. The raw material powder, with an average particle diameter of equal to or smaller than 1.5 μm, more preferably equal to or smaller than 1 μm, is easily available, due to use in a large quantity also at present, as a raw material of ITO.

However, in the case of cerium oxide powder, powder with an average particle diameter of equal to or smaller than 1.5 μm, more preferably equal to or smaller than 1 μm, suitable as raw material powder for producing the sintered body, in a state utilizable as it is without performing crushing or the like, is not easily available, due to smaller use quantity as compared with indium oxide powder. Therefore, the coarse cerium oxide powder is required to be crushed to an average particle diameter of equal to or smaller than 1.5 μm, more preferably equal to or smaller than 1 μm.

In addition, also in the case of oxide powder of at least one or more kinds of an metal element selected from the metal element group composed of titanium, zirconium, hafnium, molybdenum and tungsten, to be added thereto, similarly as in the cerium oxide powder, it is difficult to obtain raw material powder with an average particle diameter of 1.5 μm, more preferably equal to or smaller than 1 μm, therefore it is required to crushed coarse oxide powder to an average particle diameter of 1.5 μm, more preferably equal to or smaller than 1 μm.

In order to obtain the oxide sintered body of the present invention, after mixing of raw material powder containing indium oxide powder and cerium oxide powder having the above average particle diameter, the mixed powder is molded and the molding is sintered by a normal pressure sintering method, or the mixed powders are molded and sintered by a hot press method. The normal pressure sintering method is a simple and convenient, and industrially advantageous method, and thus a preferable method, however, a hot press method may be used as well, if necessary.

1) The Normal Pressure Sintering Method

In the case where the normal pressure sintering method is used to obtain the oxide sintered body, a molding is prepared first. The above raw material powder is charged into a resin pot for mixing along with a binder (for example, PVA is used) or the like, by use of a wet-type ball mill or the like. In order to obtain the oxide sintered body, it is preferable that the above ball mill mixing is performed for 18 hours or longer. In this case, as a ball for mixing, a hard-type $ZrO_2$ ball may be used. After the mixing, slurry is taken out for performing of filtration, drying and granulation. After that, the resultant granulated substance is molded, under a pressure of from about 9.8 MPa (0.1 ton/cm$^2$) to 294 MPa (3 ton/cm$^2$), by use of a cold isostatic press to obtain a molding.

In a sintering step of the normal pressure sintering method, heating is performed at a predetermined temperature range under atmosphere of oxygen presence. Sintering is performed at 1250 to 1650° C., more preferably at 1300 to 1500° C., under atmosphere where oxygen gas is introduced into air inside a sintering furnace. Sintering time is preferably from 10 to 30 hours, more preferably from 15 to 25 hours.

By use of the indium oxide powder, cerium oxide powder and oxide powder of the M element such as titanium oxide, which is adjusted to have the above average particle diameter of equal to or smaller than 1.5 μm or smaller, more preferably equal to or smaller than 1 μm, as raw material powder, and at the sintering temperature of the above range, it is possible to obtain a dense oxide sintered body, where the crystal grains made of the $CeO_2$ phase, having an average particle diameter of equal to or smaller than 3 μm, more preferably equal to or smaller than 2 μm, are finely dispersed in the $In_2O_3$ phase matrix.

The too low sintering temperature does not progress a sintering reaction sufficiently. In particular, in order to obtain the oxide sintered body with a density of equal to or higher than 6.0 g/cm$^3$, the temperature is preferably equal to or higher than 1250° C. On the other hand, the sintering temperature over 1650° C. significantly increases growth of the crystal grains of the $CeO_2$ phase in the oxide sintered body. This too large crystal grain of the $CeO_2$ phase becomes a cause of arcing.

In PATENT LITERATURE 3, similarly as in PATENT LITERATUREs 1 an 2, because quite a large quantity of titanium or tin is added, in addition to indium and cerium, in a conventional technology, cerium makes a solid solution in the indium oxide phase, however, the present invention is characterized in that, because titanium addition amount is low, and tin is not contained, cerium does not make a solid solution in the indium oxide phase.

Sintering atmosphere is preferably atmosphere in the presence of oxygen, and still more preferably atmosphere where oxygen gas is introduced into air inside the sintering furnace. Presence of oxygen in sintering enables to make higher density of the oxide sintered body. In temperature increase up to sintering temperature, in order to prevent cracking of a sintered body and progress de-binder, it is preferable to set temperature increasing rate in a range of from 0.2 to 5° C./min. In addition, as needed, different temperature increasing rates may be combined to raise temperature up to sintering temperature. In the step for increasing temperature, specific temperature may be held for a certain period aiming at progressing of de-binder or sintering. In cooling after sintering, it is preferable to stop introduction of oxygen, and lower temperature down to 1000° C. at temperature decreasing rate in a range of from 0.2 to 5° C./min, in particular, 0.2° C./min to 1° C./min.

2) The Hot Press Method

In the present invention, in the case where the hot press method is adopted in producing the oxide sintered body, the mixed powder is molded and sintered at 700 to 950° C. for 1 to 10 hours under a pressure of 2.45 to 29.40 MPa under inert gas atmosphere or in vacuum. The hot press method is capable of decreasing oxygen content in the sintered body, due to subjecting raw material powder of the oxide sintered body to molding and sintering under reducing atmosphere, as compared with the above normal pressure sintering method. However, caution is required in molding and sintering at a high temperature over 950° C., because of reduction of indium oxide and melting as metal indium.

Next, one example of production condition in the case of obtaining the oxide sintered body of the present invention by the hot press method is shown. That is, firstly, indium oxide powder with an average particle diameter of equal to or smaller than 1.5 µm, more preferably equal to or smaller than 1 µm, along with cerium oxide powder with an average particle diameter of equal to or smaller than 1.5 µm, more preferably equal to or smaller than 1 µm, still more oxide powder of at least one or more kinds of the metal element selected from the metal element group consisting of titanium, zirconium, hafnium, molybdenum and tungsten, with an average particle diameter of equal to or smaller than 1.5 µm, more preferably equal to or smaller than 1 µm are prepared as raw material powder, so as to attain predetermined ratio.

The prepared raw material powder is sufficiently mixed similarly as in ball mill mixing of a normal pressure sintering method, preferably for a mixing time of 18 hours or longer. Then the granulated mixed powder is supplied into a carbon container to be subjected to sintering by the hot press method. Sintering temperature may be set at from 700 to 950° C., pressure may be set at from 2.45 MPa to 29.40 MPa (25 to 300 kgf/cm$^2$), and sintering time may be set from about 1 to 10 hours. Atmosphere during hot press is preferably under inert gas such as Ar, or in vacuum.

In the case of obtaining a target for sputtering, more preferably, sintering temperature may be set at from 800 to 900° C., pressure may be at from 9.80 MPa to 29.40 MPa (100 to 300 kgf/cm$^2$), and sintering time may be from 1 to 3 hours.

3. The Target for Sputtering

The target for sputtering is obtained by cutting the oxide sintered body of the present invention to a predetermined size, and polishing processing of the surface to adhere to a backing plate.

It is required that the target for sputtering is controlled to have a density of equal to or higher than 6.3 g/cm$^3$, preferably equal to or higher than 6.8 g/cm$^3$, and particularly preferably equal to or higher than 7.0 g/cm$^3$. The density below 6.3 g/cm$^3$ causes cracks or fractures and nodule generation.

The density below 6.3 g/cm$^3$ provides inferior strength of the sintered body itself, and thus cracks or fractures easily generate even for small local thermal expansion.

4. The Transparent Conductive Film Containing Indium and Cerium, Along with a Film-Formation Method Thereof In the present invention, the mainly crystalline transparent conductive film is formed on a substrate, using the above oxide sintered body as the target for sputtering.

As the substrate, various plates or films may be used, such as glass, synthetic quartz, a synthetic resin such as PET or polyimide, a stainless steel plate and the like, in response to applications. In particular, because heating is required in forming the crystalline transparent conductive film, the substrate having heat resistance is necessary.

In the sputtering method, increase in direct-current power to be charged has been performed generally to enhance film-formation rate of the transparent conductive film. As described above, in the oxide sintered bodies of the present invention, the $In_2O_3$ phase of a bixbyite-type structure is a main crystal phase, and the crystal grains of the $CeO_2$ phase as a second phase are uniformly and finely dispersed, having an average particle diameter of equal to or smaller than 3 µm, and more preferably equal to or smaller than 2 µm, which little provides a starting point of nodule growth. Therefore, even when direct-current power to be charged is increased, nodule generation is suppressed and thus abnormal discharge such as arcing or the like can be suppressed.

1) Film-Formation by the Sputtering Method

In the case of forming the transparent conductive film on a substrate by the sputtering method, a target for sputtering obtained by fabricating the oxide sintered body with a density of equal to or higher than 6.3 g/cm$^3$ is used. As a sputtering method, there may be used a high frequency sputtering method (it may be referred to as an RF sputtering method), or a pulse sputtering method, however, in particular, according to a direct-current sputtering method (it may be referred to as a DC sputtering method), thermal influence in film-formation is small, and high rate film-formation is possible, and is thus industrially advantageous. It should be noted that the pulse sputtering method is a method for adopting a frequency of several hundred kHz, which is lower than a general frequency of 13.56 MHz in the high frequency sputtering method, or changing waveform of applied current and applied voltage (for example, change to a rectangular form). In order to form the transparent conductive film by the direct-current sputtering method, it is preferable to use mixed gas composed of inert gas and oxygen, in particular, argon and oxygen, as sputtering gas. In addition, it is preferable to perform sputtering by setting pressure inside a sputtering apparatus at 0.1 to 1 Pa, in particular, 0.2 to 0.8 Pa.

In the present invention, pre-sputtering may be performed, by generating direct-current plasma, for example, by vacuum exhaustion to equal to or lower than $2 \times 10^{-4}$ Pa, then introducing mixed gas composed of argon and oxygen to set gas pressure at 0.2 to 0.5 Pa, and applying direct-current power so that direct-current power relative to target area, that is, direct-current power density becomes in a range of about 1 to W/cm$^2$. It is preferable that, after performing this pre-sputtering for 5 to 30 minutes, sputtering is performed by correcting a substrate position, as needed.

In the present invention, film-formation is possible at room temperature without heating of the substrate, however, the substrate may also be heated at from 50 to 500° C., in particular, from 250 to 500° C. For example, in the blue LED requiring a highly precise transparent electrode, in order to make lower resistance by once forming an amorphous transparent conductive film, and after performing patterning by wet etching using a weak acid, and by crystallization by heat treatment under non-oxidative atmosphere, it is better for the substrate in film-formation to be maintained at low temperature such as at the vicinity of room temperature.

Other than the above, in a solar cell, because patterning by wet etching using a weak acid is not necessary, the crystalline transparent conductive film is formed by maintaining the substrate temperature at a high temperature of equal to or higher than 250° C. In addition, depending on applications, because the one with low melting point, such as a resin plate, a resin film is used, as the substrate, it is desirable, in this case, to perform film-formation without heating.

2) The Transparent Conductive Film Obtained

In this way, by using the target for sputtering prepared from the oxide sintered body of the present invention, an amorphous or crystalline transparent conductive film superior in optical characteristics and conductivity can be produced on a substrate in relatively high film-formation rate by the direct-current sputtering method.

Composition of the resultant transparent conductive film becomes nearly equal to that of the target for sputtering. Film thickness is different depending on an application, however, 10 to 1000 nm may be attained. It should be noted that the amorphous transparent conductive film can be converted to a crystalline one by heating it at 300 to 500° C. for 10 to 60 minutes under inert gas atmosphere.

Specific resistance of the crystalline transparent conductive film was calculated from a product of surface resistance measured by a four-probe method using a resistivity meter, and film thickness, and is equal to or lower than $8 \times 10^{-4}$ $\Omega \cdot cm$. It should be noted that even when being amorphous, it is well possible that the specific resistance shows equal to or lower than $8 \times 10^{-4}$ $\Omega \cdot cm$. Carrier electron concentration and mobility thereof of the crystalline transparent conductive film are determined by hole effect measurement and the latter is equal to or higher than 35 $cm^2V^{-1}s^{-1}$. A generated phase of this film is identified by X-ray diffraction measurement, and found to be only the indium oxide phase, different from the oxide sintered body. In addition, refractive index is measured using a spectro-elipsometer, and is equal to or higher than 2.1 at a wavelength of 460 nm.

It should be noted that the crystalline or amorphous transparent conductive film formed by the oxide sintered body of the present invention is suitable for also applications not requiring low specific resistance and requiring only high refractive index, for example, an optical disk application and the like.

EXAMPLES

Explanation will be given below specifically on the present invention with reference to Examples and Comparative Examples, however, the present invention should not be limited thereto.

(Evaluation of the Oxide Sintered Body)

By use of a mill end, density of the oxide sintered body obtained was determined by the Archimedes' method. Subsequently a part of the mill end was crushed to perform identification of generated phases of the resultant oxide sintered body by a powder method, with an X-ray diffraction apparatus (X'pert PRO MPD, manufactured by Philips Co., Ltd.). Then, X-ray diffraction peak intensity ratio (I), defined by the following formula, was determined:

$$I = [CeO_2 phase(111)/In_2O_3 phase(222)] \times 100 [\%] \quad (1)$$

In addition, by using a part of the powder, composition analysis of the oxide sintered body was performed by an ICP emission spectroscopy. Still more, with a scanning electron microscope, and an energy dispersive X-ray analysis method (SEM-EDS, ULTRA55, manufactured by Carl Zeiss Japan Co., Ltd., and QuanTax QX400, manufactured by Bulker Japan Cp., Ltd.), texture observation of the oxide sintered body, along with surface analysis were performed. From the image analysis result of these images, average particle diameter of the crystal grains composed of the $CeO_2$ phase was determined.

(Evaluation of Fundamental Characteristics of the Transparent Conductive Film)

Composition of the resultant transparent conductive film was studied by an ICP emission spectroscopy. Film thickness of the transparent conductive film was measured with a surface roughness tester (Alpha-Step IQ, manufactured by Tencor Japan Corp.). Film-formation rate was calculated from film thickness and film-formation time. Specific resistance of the film was calculated from a product of surface resistance measured by a four-probe method using a resistivity meter (Loresta EP MCP-T360 model, manufactured by DIA Instruments Co., Ltd.), and film thickness. Carrier electron concentration of the film and mobility thereof were determined by hole effect measurement. A generated phase of the film was identified by X-ray diffraction measurement, similarly as in the oxide sintered body. In addition, refractive index was measured using a spectro-elipsometer (VASE, manufactured by J. A. Woolam Co., Ltd.), and to evaluate characteristics for, in particular, blue light, refractive index of a wavelength of 460 nm was compared.

Example 1

Zinc oxide powder and cerium oxide powder were adjusted to have an average particle diameter of equal to or smaller than 1 μm to prepare raw material powder. The powder were prepared, so that cerium content is 9% by atom, as atom number ratio represented by Ce/(In+Ce), and charged in a pot made of a resin, together with water to mix in a wet-type ball mill. In this case, hard-type $ZrO_2$ balls were used, and mixing time was set to 18 hours. After the mixing, slurry was taken out, filtered, dried and granulated. The granulated substance was converted to a molding under a pressure of 3 tons/$cm^2$, using a cold isostatic press.

Then, the molding was sintered as follows. Sintering was performed under atmosphere by introducing oxygen into air inside a sintering furnace in a rate of 5 L/minute per 0.1 $m^3$ of furnace volume, at a sintering temperature of 1400° C. for 20 hours. In this case, temperature increasing rate was 1° C./minute, and in cooling after sintering, oxygen introduction was stopped, and temperature was cooled to 1000° C., at a rate of 10° C./minute.

The resultant oxide sintered body was processed to a size of 152 mm in diameter and 5 mm in thickness, and the sputtering surface thereof was polished using a cup grinding stone so that maximal height, Rz, becomes equal to or lower than 3.0 μm. The processed oxide sintered body was bond to a backing plate made of oxygen-free copper using metal indium, to prepare a sputtering target.

Figure 2:
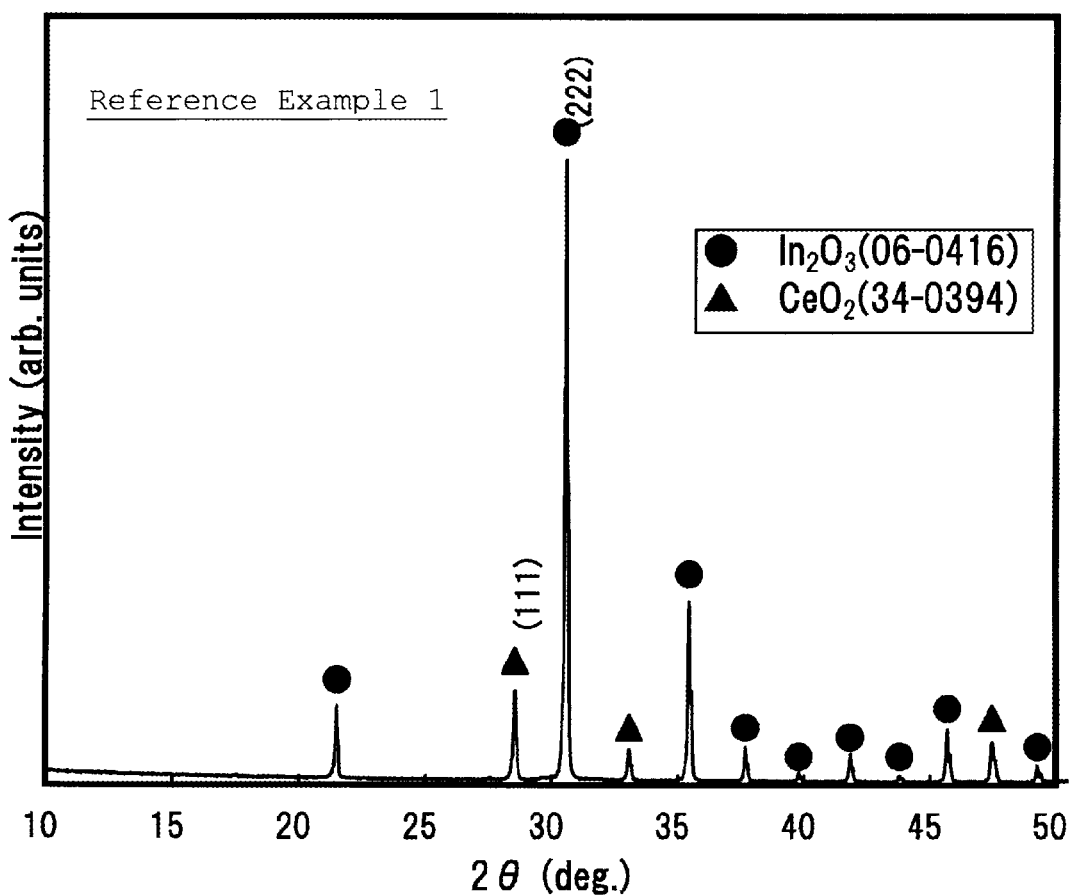
FIG. 2 is a chart showing an X-ray diffraction measurement result of the oxide sintered body of Example 1, containing indium and cerium as oxides, wherein the cerium content is 9% by atom, as an atomicity ratio of Ce/(In+Ce), and being composed of an $In_2O_3$ phase of a bixbyite-type structure and a $CeO_2$ phase of a fluorite-type structure.

Composition analysis of the resultant oxide sintered body was performed by an ICP emission spectrometry, and it was confirmed to be nearly the same as charging composition in blending raw material powder. Next, as shown in FIG. 2, phase identification of the oxide sintered body was performed by X-ray diffraction measurement. From FIG. 2, it was confirmed to be composed of the $In_2O_3$ phase with a bixbyite-type structure, and the $CeO_2$ phase with a fluorite-type structure. X-ray diffraction peak intensity ratio of the $CeO_2$ phase (111), represented by the above equation (1), was 16%.

Density of the oxide sintered body was measured and found to be 6.87 g/$cm^3$. Subsequently, texture observation of the oxide sintered body was performed with SEM (refer to the above FIG. 1), and found that average particle diameter of the $CeO_2$ phase was 1.1 μm. These results are shown in Table 1.

Next, the sputtering target was attached to a cathode for a non-magnetic substance target of a direct-current magnetron sputtering apparatus (SPF-530H, manufactured by ANELVA Corp.) equipped with a direct-current power source not having arc-discharge suppression function. Synthesis quartz, with a size of 50 mm in side length and 0.5 mm in thickness, was used as a substrate, and distance between the target and the substrate was fixed to 49 mm. Mixed gas of argon and oxygen was introduced, so that ratio of oxygen was 1.0%, after vacuum exhausting to below $1×10^{-4}$ Pa, to adjust gas pressure to 0.3 Pa. It should be noted that in the above ratio of oxygen of 1.0%, specific resistance exhibited the lowest value.

A direct-current power of 200 W (1.10 $W/cm^2$) was applied to generate direct-current plasma to perform sputtering. The direct-current sputtering was continued till attaining a cumulative charge power value of 12.8 KWh, which is calculated from a product of direct-current power charged and sputtering time. Arcing did not generate during this period, and discharge was stable. After completion of the sputtering, the target surface was observed and found no particular nodule generation. Then by changing direct-current power to 200, 400, 500 and 600 W (1.10 to 3.29 $W/cm^2$), sputtering was performed for 10 minutes under each power to measure arcing occurrence number of times. Under any power, arcing did not generate, and average arcing occurrence number of times per minute under each direct-current power was zero.

Subsequently, film-formation was performed by direct-current sputtering. After pre-sputtering for 10 minutes, the substrate was arranged just over the sputtering target, that is, at a stationary opposed position, and sputtering was performed at a substrate temperature of 500° C. to form a transparent conductive film with a film thickness of 200 nm. It was confirmed that the composition of the resultant transparent conductive film was nearly the same as that of the target.

By measurement of specific resistance of the film, it was found to be $6.6×10^{-4}$ Ω·cm. In addition, measurement of hole effect was performed and found that carrier electron concentration was $2.6×10^{20}$ $cm^{-3}$, and carrier electron mobility was 36 $cm^2V^{-1}s^{-1}$. Refractive index of a wavelength of 460 nm was 2.21. Crystallinity of the film was identified by X-ray diffraction measurement, and confirmed to be to be a crystalline film composed of an indium oxide phase only, and cerium to be in a solid solution state in the indium oxide phase.

Example 2

An oxide sintered body along with a sputtering target were prepared by a similar method as in Example 1, except that raw material powder, adjusted to have an average particle diameter of equal to or smaller than 1.5 μm, was prepared, so that cerium content became 7% by atom, as atom number ratio represented by Ce/(In+Ce).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure, and the $CeO_2$ phase with a fluorite-type structure. X-ray diffraction peak intensity ratio of the $CeO_2$ phase (111), represented by the above equation (1), was 14%.

Density of the oxide sintered body was measured and found to be 6.88 $g/cm^3$. Subsequently, texture observation of the oxide sintered body was performed with SEM, and found that average particle diameter of the $CeO_2$ phase was 2.7 μm.

Next, by a similar method as in Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Example 1. It should be noted that substrate temperature was set at 500° C. to form a transparent conductive film with a film thickness of 200 nm. It was confirmed that the composition of the resultant transparent conductive film was nearly the same as that of the target.

By measurement of specific resistance of the film, it was found to be $5.4×10^{-4}$ Ω·cm. In addition, measurement of hole effect was performed and found that carrier electron concentration was $2.5×10^{20}$ $cm^{-3}$, and carrier electron mobility was 46 $cm^2V^{-1}s^{-1}$. Refractive index of a wavelength of 460 nm was 2.20. Crystallinity of the film was identified by X-ray diffraction measurement, and confirmed to be to be a crystalline film composed of an indium oxide phase only, and cerium to be in a solid solution state in the indium oxide phase.

Example 3

An oxide sintered body along with a sputtering target were prepared by a similar method as in Example 1, except that raw material powder, adjusted to have an average particle diameter of equal to or smaller than 1 μm, was prepared, so that cerium content became 5% by atom, as atom number ratio represented by Ce/(In+Ce).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure, and the $CeO_2$ phase with a fluorite-type structure. X-ray diffraction peak intensity ratio of the $CeO_2$ phase (111), represented by the above equation (1), was 9%.

Density of the oxide sintered body was measured and found to be 6.92 $g/cm^3$. Subsequently, texture observation of the oxide sintered body was performed with SEM, and found that average particle diameter of the $CeO_2$ phase was 1.3 μm.

Next, by a similar method as in Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Example 1. It should be noted that substrate temperature was set at 400° C. to form a transparent conductive film with a film thickness of 200 nm. It was confirmed that the composition of the resultant transparent conductive film was nearly the same as that of the target.

By measurement of specific resistance of the film, it was found to be $4.6 \times 10^{-4}$ Ω·cm. In addition, measurement of hole effect was performed and found that carrier electron concentration was $2.4 \times 10^{20}$ cm$^{-3}$, and carrier electron mobility was 57 cm$^2$V$^{-1}$s$^{-1}$. Refractive index of a wavelength of 460 nm was 2.19. Crystallinity of the film was identified by X-ray diffraction measurement, and confirmed to be to be a crystalline film composed of an indium oxide phase only, and cerium to be in a solid solution state in the indium oxide phase.

Next, substrate temperature was set at room temperature (25° C.) to perform film-formation by a direct-current sputtering, and then heat treatment was performed under nitrogen.

By measurement of specific resistance of the film formed at room temperature, it was found to be $7.5 \times 10^4$ Ω·cm. In addition, measurement of hole effect was performed and found that carrier electron concentration was $4.9 \times 10^{20}$ cm$^{-3}$, and carrier electron mobility was 17 cm$^2$V$^{-1}$s$^{-1}$. Refractive index of a wavelength of 460 nm was 2.17. Crystallinity of the film was identified by X-ray diffraction measurement, and confirmed to be to be an amorphous film.

Subsequently, heat treatment of this amorphous film was performed at 400° C. for 30 minutes under nitrogen atmosphere. As a result, specific resistance of the film was found to be $4.9 \times 10^{-4}$ Ω·cm. In addition, measurement of hole effect was performed and found that carrier electron concentration was $2.2 \times 10^{20}$ cm$^{-3}$, and carrier electron mobility was 58 cm$^2$V$^{-1}$s$^{-1}$. Refractive index of a wavelength of 460 nm was 2.20. Crystallinity of the film was identified by X-ray diffraction measurement, and confirmed to be to be a crystalline film composed of an indium oxide phase only, and cerium to be in a solid solution state in the indium oxide phase.

Example 4

An oxide sintered body along with a sputtering target were prepared by a similar method as in Example 1, except that raw material powder, adjusted to have an average particle diameter of equal to or smaller than 1.5 μm, was prepared, so that cerium content became 4% by atom, as atom number ratio represented by Ce/(In+Ce).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase with a bixbyite-type structure, and the CeO$_2$ phase with a fluorite-type structure. X-ray diffraction peak intensity ratio of the CeO$_2$ phase (111), represented by the above equation (1), was 8%.

Density of the oxide sintered body was measured and found to be 6.91 g/cm$^3$. Subsequently, texture observation of the oxide sintered body was performed with SEM, and found that average particle diameter of the CeO$_2$ phase was 2.8 μm.

Next, by a similar method as in Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Example 1. It should be noted that substrate temperature was set at 400° C. to form a transparent conductive film with a film thickness of 200 nm. It was confirmed that the composition of the resultant transparent conductive film was nearly the same as that of the target.

By measurement of specific resistance of the film, it was found to be $4.2 \times 10^{-4}$ Ω·cm. In addition, measurement of hole effect was performed and found that carrier electron concentration was $2.3 \times 10^{20}$ cm$^{-3}$, and carrier electron mobility was 65 cm$^2$V$^{-1}$s$^{-1}$. Refractive index of a wavelength of 460 nm was 2.17. Crystallinity of the film was identified by X-ray diffraction measurement, and confirmed to be to be a crystalline film composed of an indium oxide phase only, and cerium to be in a solid solution state in the indium oxide phase.

Example 5

An oxide sintered body along with a sputtering target were prepared by a similar method as in Example 1, except that raw material powder, adjusted to have an average particle diameter of equal to or smaller than 1 μm, was prepared, so that cerium content became 1% by atom, as atom number ratio represented by Ce/(In+Ce).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase with a bixbyite-type structure, and the CeO$_2$ phase with a fluorite-type structure. X-ray diffraction peak intensity ratio of the CeO$_2$ phase (111), represented by the above equation (1), was 2%.

Density of the oxide sintered body was measured and found to be 6.86 g/cm$^3$. Subsequently, texture observation of the oxide sintered body was performed with SEM, and found that average particle diameter of the CeO$_2$ phase was 1.1 μm.

Next, by a similar method as in Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Example 1. It should be noted that substrate temperature was set at 400° C. to form a transparent conductive film with a film thickness of 200 nm. It was confirmed that the composition of the resultant transparent conductive film was nearly the same as that of the target.

By measurement of specific resistance of the film, it was found to be $4.4 \times 10^{-4}$ Ω·cm. In addition, measurement of hole effect was performed and found that carrier electron concentration was $1.6 \times 10^{20}$ cm$^{-3}$, and carrier electron mobility was 88 cm$^2$V$^{-1}$s$^{-1}$. Refractive index of a wavelength of 460 nm was 2.14. Crystallinity of the film was identified by X-ray diffraction measurement, and confirmed to be to be a crystalline film composed of an indium oxide phase only, and cerium to be in a solid solution state in the indium oxide phase.

Example 6

An oxide sintered body along with a sputtering target were prepared by a similar method as in Example 1, except that raw material powder, adjusted to have an average particle diameter of equal to or smaller than 1 μm, was prepared, so that cerium content became 0.3% by atom, as atom number ratio represented by Ce/(In+Ce).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure, and the $CeO_2$ phase with a fluorite-type structure. X-ray diffraction peak intensity ratio of the $CeO_2$ phase (111), represented by the above equation (1), was 0.5%.

Density of the oxide sintered body was measured and found to be 6.70 g/cm$^3$. Subsequently, texture observation of the oxide sintered body was performed with SEM, and found that average particle diameter of the $CeO_2$ phase was 1.2 μm.

Next, by a similar method as in Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Example 1. It should be noted that substrate temperature was set at 300° C. to form a transparent conductive film with a film thickness of 200 nm. It was confirmed that the composition of the resultant transparent conductive film was nearly the same as that of the target.

By measurement of specific resistance of the film, it was found to be $7.6 \times 10^{-4}$ Ω·cm. In addition, measurement of hole effect was performed and found that carrier electron concentration was $1.0 \times 10^{20}$ cm$^{-3}$, and carrier electron mobility was 82 cm$^2$V$^{-1}$s$^{-1}$. Refractive index of a wavelength of 460 nm was 2.13. Crystallinity of the film was identified by X-ray diffraction measurement, and confirmed to be to be a crystalline film composed of an indium oxide phase only, and cerium to be in a solid solution state in the indium oxide phase.

Reference Example 1

An oxide sintered body along with a sputtering target were prepared by a similar method as in Example 1, except that raw material powder was obtained, by adjusting indium oxide powder, cerium oxide powder and titanium oxide powder to have an average particle diameter of equal to or smaller than 1.5 μm, so that cerium content became 8% by atom, as atom number ratio represented by Ce/(In+Ce+Ti), and titanium content became 1% by atom, as atom number ratio represented by Ti/(In+Ce+Ti).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure, and the $CeO_2$ phase with a fluorite-type structure. X-ray diffraction peak intensity ratio of the $CeO_2$ phase (111), represented by the above equation (1), was 25%.

Density of the oxide sintered body was measured and found to be 7.06 g/cm$^3$. Subsequently, texture observation of the oxide sintered body was performed with SEM, and found that average particle diameter of the $CeO_2$ phase was 2.7 μm.

Next, by a similar method as in Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Example 1. It should be noted that substrate temperature was set at 400° C. to form a transparent conductive film with a film thickness of 200 nm. It was confirmed that the composition of the resultant transparent conductive film was nearly the same as that of the target.

By measurement of specific resistance of the film, it was found to be $5.6 \times 10^{-4}$ Ω·cm. In addition, measurement of hole effect was performed and found that carrier electron concentration was $3.1 \times 10^{20}$ cm$^{-3}$, and carrier electron mobility was 36 cm$^2$V$^{-1}$s$^{-1}$. Refractive index of a wavelength of 460 nm was 2.14. Crystallinity of the film was identified by X-ray diffraction measurement, and confirmed to be to be a crystalline film composed of an indium oxide phase only, and cerium to be in a solid solution state in the indium oxide phase.

Reference Example 2

An oxide sintered body along with a sputtering target were prepared by a similar method as in Example 1, except that raw material powder was obtained, by adjusting indium oxide powder, cerium oxide powder and titanium oxide powder to have an average particle diameter of equal to or smaller than 1 μm, so that cerium content became 5% by atom, as atom number ratio represented by Ce/(In+Ce+Ti), and titanium content became 0.5% by atom, as atom number ratio represented by Ti/(In+Ce+Ti).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure, and the $CeO_2$ phase with a fluorite-type structure. X-ray diffraction peak intensity ratio of the $CeO_2$ phase (111), represented by the above equation (1), was 14%.

Density of the oxide sintered body was measured and found to be 7.01 g/cm$^3$. Subsequently, texture observation of the oxide sintered body was performed with SEM, and found that average particle diameter of the $CeO_2$ phase was 1.5 μm.

Next, by a similar method as in Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Example 1. It should be noted that substrate temperature was set at 400° C. to form a transparent conductive film with a film thickness of 200 nm. It was confirmed that the composition of the resultant transparent conductive film was nearly the same as that of the target.

By measurement of specific resistance of the film, it was found to be 5.4×10$^{-4}$ Ω·cm. In addition, measurement of hole effect was performed and found that carrier electron concentration was 2.5×10$^{20}$ cm$^{-3}$, and carrier electron mobility was 46 cm$^2$V$^{-1}$s$^{-1}$. Refractive index of a wavelength of 460 nm was 2.17. Crystallinity of the film was identified by X-ray diffraction measurement, and confirmed to be to be a crystalline film composed of an indium oxide phase only, and cerium to be in a solid solution state in the indium oxide phase.

Reference Example 3

An oxide sintered body along with a sputtering target were prepared by a similar method as in Example 1, except that raw material powder was obtained, by adjusting indium oxide powder, cerium oxide powder and titanium oxide powder to have an average particle diameter of equal to or smaller than 1 μm, so that cerium content became 4% by atom, as atom number ratio represented by Ce/(In+Ce+Ti), and titanium content became 1% by atom, as atom number ratio represented by Ti/(In+Ce+Ti).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase with a bixbyite-type structure, and the CeO$_2$ phase with a fluorite-type structure. X-ray diffraction peak intensity ratio of the CeO$_2$ phase (111), represented by the above equation (1), was 7%.

Density of the oxide sintered body was measured and found to be 7.06 g/cm$^3$. Subsequently, texture observation of the oxide sintered body was performed with SEM (refer to FIG. 5), and found that average particle diameter of the CeO$_2$ phase was 1.1 μm.

Next, by a similar method as in Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Example 1. It should be noted that substrate temperature was set at 400° C. to form a transparent conductive film with a film thickness of 200 nm. It was confirmed that the composition of the resultant transparent conductive film was nearly the same as that of the target.

By measurement of specific resistance of the film, it was found to be 5.0×10$^{-4}$ Ω·cm. In addition, measurement of hole effect was performed and found that carrier electron concentration was 2.5×10$^{20}$ cm$^{-3}$, and carrier electron mobility was 50 cm$^2$V$^{-1}$s$^{-1}$. Refractive index of a wavelength of 460 nm was 2.16. Crystallinity of the film was identified by X-ray diffraction measurement, and confirmed to be to be a crystalline film composed of an indium oxide phase only, and cerium to be in a solid solution state in the indium oxide phase.

Reference Example 4

An oxide sintered body along with a sputtering target were prepared by a similar method as in Example 1, except that raw material powder was obtained, by adjusting indium oxide powder, cerium oxide powder and titanium oxide powder to have an average particle diameter of equal to or smaller than 1 μm, so that cerium content became 0.3% by atom, as atom number ratio represented by Ce/(In+Ce+Ti), and titanium content became 0.3% by atom, as atom number ratio represented by Ti/(In+Ce+Ti).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase with a bixbyite-type structure, and the CeO$_2$ phase with a fluorite-type structure. X-ray diffraction peak intensity ratio of the CeO$_2$ phase (111), represented by the above equation (1), was 1%.

Density of the oxide sintered body was measured and found to be 7.05 g/cm$^3$. Subsequently, texture observation of the oxide sintered body was performed with SEM, and found that average particle diameter of the CeO$_2$ phase was 1.0 μm.

Next, by a similar method as in Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Example 1. It should be noted that substrate temperature was set at 300° C. to form a transparent conductive film with a film thickness of 200 nm. It was confirmed that the composition of the resultant transparent conductive film was nearly the same as that of the target.

By measurement of specific resistance of the film, it was found to be 5.0×10$^{-4}$ Ω·cm. In addition, measurement of hole effect was performed and found that carrier electron concentration was 1.5×10$^{20}$ cm$^{-3}$, and carrier electron mobility was 83 cm$^2$V$^{-1}$s$^{-1}$. Refractive index of a wavelength of 460 nm was 2.12. Crystallinity of the film was identified by X-ray diffraction measurement, and confirmed to be to be a crystalline film composed of an indium oxide phase only, and cerium to be in a solid solution state in the indium oxide phase.

Reference Example 5

An oxide sintered body along with a sputtering target were prepared by a similar method as in Example 1, except that raw material powder was obtained, by adjusting indium oxide powder, cerium oxide powder and zirconium oxide powder to have an average particle diameter of equal to or smaller than 1 μm, so that cerium content became 0.3% by atom, as atom number ratio represented by Ce/(In+Ce+Zr), and zirconium content became 0.3% by atom, as atom number ratio represented by Zr/(In+Ce+Zr).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase with a bixbyite-type structure, and the CeO$_2$ phase with a fluorite-type structure. X-ray diffraction peak intensity ratio of the CeO$_2$ phase (111), represented by the above equation (1), was 1%.

Density of the oxide sintered body was measured and found to be 6.98 g/cm$^3$. Subsequently, texture observation of the oxide sintered body was performed with SEM, and found that average particle diameter of the CeO$_2$ phase was 1.0 μm.

Next, by a similar method as in Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Example 1. It should be noted that substrate temperature was set at 300° C. to form a transparent conductive film with a film thickness of 200 nm. It was confirmed that the composition of the resultant transparent conductive film was nearly the same as that of the target.

By measurement of specific resistance of the film, it was found to be 5.2×10$^{-4}$ Ω·cm. In addition, measurement of hole effect was performed and found that carrier electron concentration was 1.5×10$^{20}$ cm$^{-3}$, and carrier electron mobility was 80 cm$^2$V$^{-1}$s$^{-1}$. Refractive index of a wavelength of 460 nm was 2.12. Crystallinity of the film was identified by X-ray diffraction measurement, and confirmed to be to be a crystalline film composed of an indium oxide phase only, and cerium and zirconium to be in a solid solution state in the indium oxide phase.

It should be noted that nearly the same result was obtained, also in the case where hafnium, molybdenum or tungsten was added in the same composition, instead of zirconium.

Example 7

Film-formation was performed by changing a film-formation method to an ion plating method using a tablet composed of an oxide sintered body having a cerium content of 2% by atom, as an atomicity ratio represented by Ce/(In+Ce).

A method for preparing the oxide sintered body was nearly the same as in the case of the sputtering target of Example 1, however, as described above, in the case of using as the tablet for ion plating, it is necessary to decrease density, therefore, sintering temperature was set as 1100° C. The tablet was molded in advance so as to attain dimension after sintering of a diameter of 30 mm and a height of 40 mm. Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase with a bixbyite-type structure, and the CeO$_2$ phase with a fluorite-type structure. X-ray diffraction peak intensity ratio of the CeO$_2$ phase (111), represented by the above equation (1), was 4%. Density of the oxide sintered body was measured and found to be 4.67 g/cm$^3$. Subsequently, texture observation of the oxide sintered body was performed with SEM, and found that average particle diameter of the CeO$_2$ phase was 1.0 μm.

Discharge was continued, using a plasma gun by an ion plating method, using such an oxide sintered body as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and O$_2$ flow rate at 10 sccm. A problem of splash or the like did not occur during a period until the tablet became not usable.

After replacing the tablet, film-formation was performed. It should be noted that substrate temperature was set at 300° C. to form a transparent conductive film with a film thickness of 200 nm. It was confirmed that the composition of the resultant transparent conductive film was nearly the same as that of the target.

By measurement of specific resistance of the film, it was found to be 3.3×10$^{-4}$ Ω·cm. In addition, measurement of hole effect was performed and found that carrier electron concentration was 2.1×10$^{20}$ cm$^{-3}$, and carrier electron mobility was 92 cm$^2$V$^{-1}$s$^{-1}$. Refractive index of a wavelength of 460 nm was 2.13. Crystallinity of the film was identified by X-ray diffraction measurement, and confirmed to be to be a crystalline film composed of an indium oxide phase only, and cerium to be in a solid solution state in the indium oxide phase.

Comparative Example 1

An oxide sintered body along with a sputtering target were prepared by a similar method as in Example 1, except that raw material powder, adjusted to have an average particle diameter of equal to or smaller than 1 μm, was prepared, so that cerium content became 0.10 by atom, as atom number ratio represented by Ce/(In+Ce).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of only the In$_2$O$_3$ phase with a bixbyite-type structure.

Density of the oxide sintered body was measured and found to be 6.74 g/cm$^3$. Subsequently, texture observation of the oxide sintered body was performed with SEM, and such an aspect was observed as quite a small quantity of the CeO$_2$ phase was scattered about. Average particle diameter of the CeO$_2$ phase was 1.0 μm.

Next, by a similar method as in Example 1, arcing occurrence in direct-current sputtering was studied. Arcing did not generate till attaining a cumulative charge power value of 12.8 KWh, and discharge was stable. In addition, in the case of changing direct-current power, arcing occurrence number of times per minute under each direct-current power was also zero.

Subsequently, similarly as in Example 1, film-formation was performed by direct-current sputtering. It should be noted that substrate temperature was set at 300° C. to form a transparent conductive film with a film thickness of 200 nm. It was confirmed that the composition of the resultant transparent conductive film was nearly the same as that of the tablet.

By measurement of specific resistance of the film, showing as high value as 1.3×10$^{-3}$ Ω·cm. In addition, measurement of hole effect was performed and found that carrier electron concentration was 6.2×10$^{20}$ cm$^{-3}$, and carrier electron mobility was 68 cm$^2$V$^{-1}$s$^{-1}$. Refractive index of a wavelength of 460 nm was 2.12. Crystallinity of the film was identified by X-ray diffraction measurement, and confirmed to be to be a crystalline film composed of an indium oxide phase only, and cerium to be in a solid solution state in the indium oxide phase.

Comparative Example 2

An oxide sintered body along with a sputtering target were prepared by a similar method as in Example 1, except that raw material powder, adjusted to have an average particle diameter of equal to or smaller than 1.5 μm, was prepared, so that cerium content became 11% by atom, as atom number ratio represented by Ce/(In+Ce).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of only the $In_2O_3$ phase with a bixbyite-type structure, and the $CeO_2$ phase of a fluorite-type structure. X-ray diffraction peak intensity ratio of the $CeO_2$ phase (111), represented by the above equation (1), was as high as 28%.

Density of the oxide sintered body was measured and found to be a little lower value of 6.69 $g/cm^3$. Subsequently, texture observation of the oxide sintered body was performed with SEM, and found that average particle diameter of the $CeO_2$ phase was 2.6 μm. In addition, such an aspect was observed as crystal grains of the $In_2O_3$ phase were converted to a little fine size, which was estimated to be caused by increase in volume ratio of crystal grains of the $CeO_2$ phase. It is considered that, in this way, X-ray diffraction peak intensity ratio of the $CeO_2$ phase (111) expressed by the above formula (1), became high.

Next, by a similar method as in Example 1, arcing occurrence in direct-current sputtering was studied. Arcing did not generate till attaining a cumulative charge power value of 12.8 KWh, and discharge was stable. In addition, in the case of changing direct-current power, arcing occurrence number of times per minute under each direct-current power was also zero.

Subsequently, similarly as in Reference Example 1, film-formation was performed by direct-current sputtering. It should be noted that substrate temperature was set at 500° C. to form a transparent conductive film with a film thickness of 200 nm. It was confirmed that the composition of the resultant transparent conductive film was nearly the same as that of the tablet.

By measurement of specific resistance of the film, showing as high value as $1.0 \times 10^{-3}$ Ω·cm. In addition, measurement of hole effect was performed and found that carrier electron concentration was $2.8 \times 10^{20}$ $cm^{-3}$, and carrier electron mobility was 21 $cm^2V^{-1}s^{-1}$. Refractive index of a wavelength of 460 nm was 2.18. Crystallinity of the film was identified by X-ray diffraction measurement, and confirmed to be to be a crystalline film composed of an indium oxide phase only, and cerium to be in a solid solution state in the indium oxide phase.

Comparative Example 3

An oxide sintered body along with a sputtering target was prepared by a similar method as in Example 1, except that cerium oxide powder with an average particle diameter of 2 μm was used as raw material powder.

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of only the $In_2O_3$ phase with a bixbyite-type structure, and the $CeO_2$ phase of a fluorite-type structure. X-ray diffraction peak intensity ratio of the $CeO_2$ phase (111), represented by the above equation (1), was as high as 18%.

Density of the oxide sintered body was measured and found to be 6.72 $g/cm^3$. Subsequently, texture observation of the oxide sintered body was performed with SEM, and found that average particle diameter of the $CeO_2$ phase was 4.2 μm.

Figure 3:
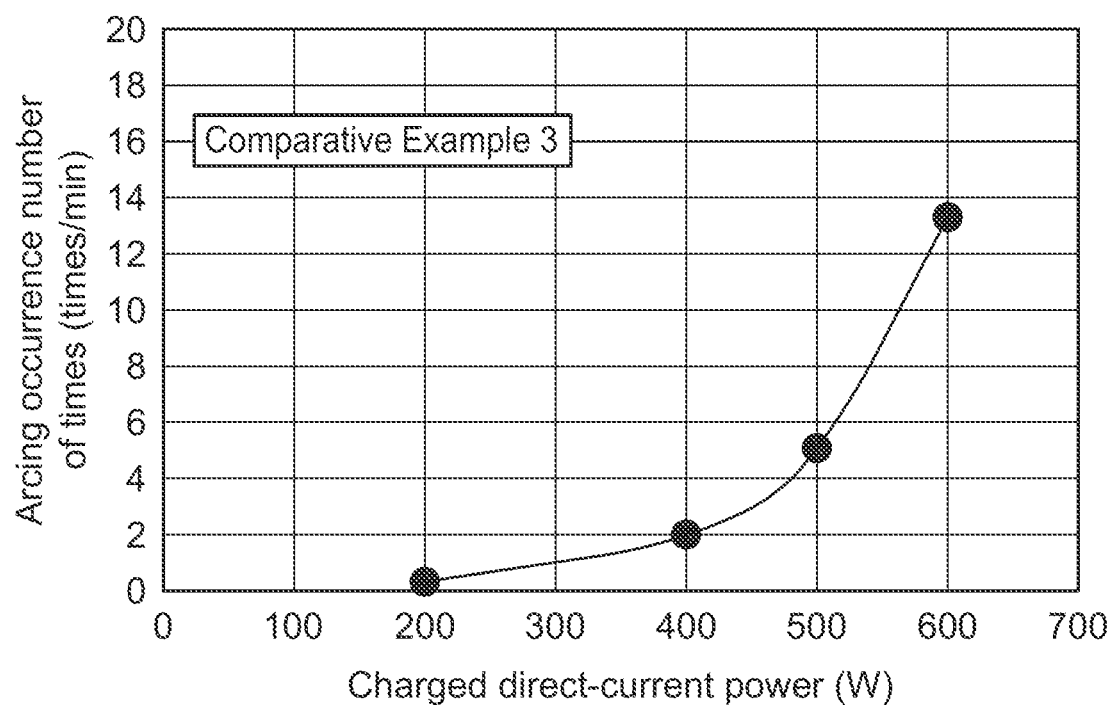
FIG. 3 is a graph showing an arcing generation state in sputtering using the oxide sintered body of Comparative Example 3.
Figure 4:
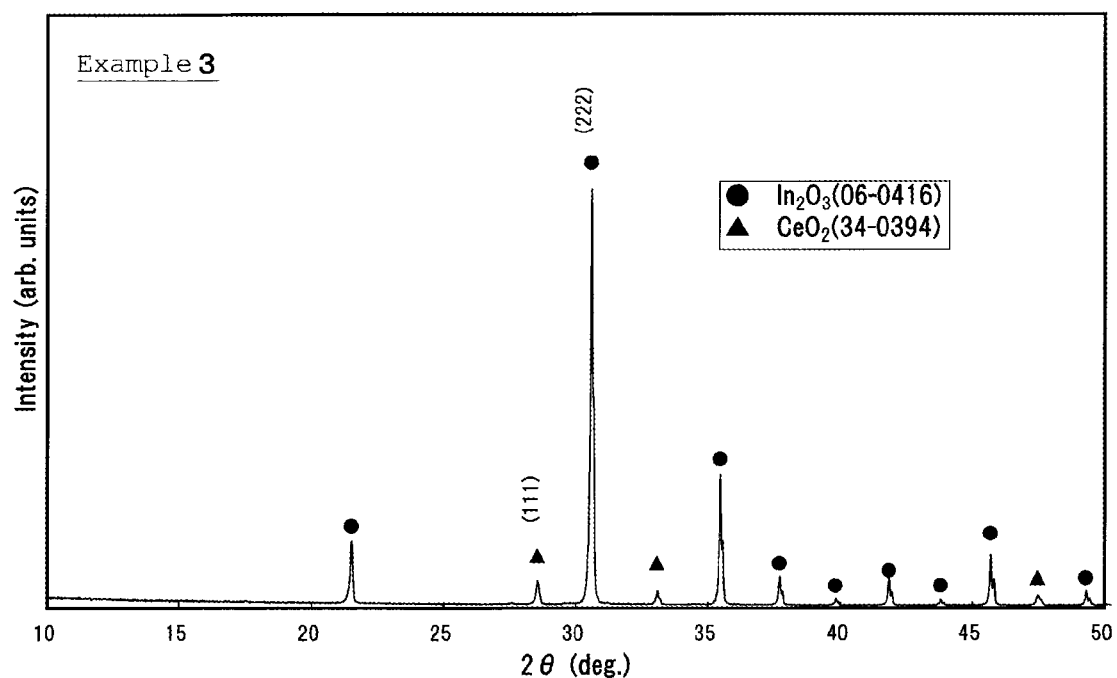
FIG. 4 is a chart showing an X-ray diffraction measurement result of the oxide sintered body of Reference Example 3, containing indium, cerium and titanium as oxides, wherein the cerium content is 4% by atom, as an atomicity ratio of Ce/(In+Ce+Ti) and the titanium content is 1% by atom, as an atomicity ratio of Ti/(In+Ce+Ti), and being composed of an $In_2O_3$ phase of a bixbyite-type structure and a $CeO_2$ phase of a fluorite-type structure.

Next, by a similar method as in Example 1, arcing occurrence in direct-current sputtering was studied. Direct-current sputtering was performed till attaining a cumulative charge power value of 12.8 KWh. Arcing did not generate for a while after starting the sputtering, however, after elapsing of a cumulative time for 11.2 kWh, arcing generated increasingly. After attaining the cumulative time, the target surface was observed to confirm generation of many nodules. Subsequently, by changing direct-current power to 200, 400, 500 and 600 W, sputtering was performed for 10 minutes under each power to measure arcing occurrence number of times. In FIG. 3, average arcing occurrence number of times per minute at each direct-current power was shown, together with Reference Example 2. From FIG. 3, it is clear that arcing generated frequently with increase in direct-current power. It should be noted that film-formation was not performed because of frequent occurrence of arcing.

Comparative Example 4

An oxide sintered body along with a sputtering target were prepared by a similar method as in Example 1, except that raw material powder was obtained, by adjusting indium oxide powder, cerium oxide powder and titanium oxide powder to have an average particle diameter of equal to or smaller than 1 μm, so that cerium content became 0.3% by atom, as atom number ratio represented by Ce/(In+Ce+Ti), and titanium content became 3% by atom, as atom number ratio represented by Ti/(In+Ce+Ti).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and the diffraction peak derived from only the $In_2O_3$ phase with a bixbyite-type structure was observed, and the diffraction peak derived from the $CeO_2$ phase with a fluorite-type structure was not observed. Density of the oxide sintered body was measured and found to be 7.04 $g/cm^3$.

Next, by a similar method as in Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Example 1. It should be noted that substrate temperature was set at 300° C. to form a transparent conductive film with a film thickness of 200 nm. It was confirmed that the composition of the resultant transparent conductive film was nearly the same as that of the target.

By measurement of specific resistance of the film, it was found to be $3.0 \times 10^{-4}$ Ω·cm. In addition, measurement of hole effect was performed and found that carrier electron concentration was $5.6 \times 10^{20}$ cm$^{-3}$, and carrier electron mobility was 37 cm$^2$V$^{-1}$s$^{-1}$. Refractive index of a wavelength of 460 nm was as low as 2.07. Crystallinity of the film was identified by X-ray diffraction measurement, and confirmed to be to be a crystalline film composed of an indium oxide phase only, and cerium and titanium to be in a solid solution state in the indium oxide phase.

Comparative Example 5

An oxide sintered body along with a sputtering target were prepared by a similar method as in Example 1, except that raw material powder was obtained, by adjusting indium oxide powder, cerium oxide powder and tin oxide powder to have an average particle diameter of equal to or smaller than 1 μm, so that cerium content became 0.3% by atom, as atom number ratio represented by Ce/(In+Ce+Sn), and tin content became 3% by atom, as atom number ratio represented by Sn/(In+Ce+Sn).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and the diffraction peak derived from only the In$_2$O$_3$ phase with a bixbyite-type structure was observed, and the diffraction peak derived from the CeO$_2$ phase with a fluorite-type structure was not observed. Density of the oxide sintered body was measured and found to be 7.09 g/cm$^3$.

Next, by a similar method as in Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Example 1. It should be noted that substrate temperature was set at 300° C. to form a transparent conductive film with a film thickness of 200 nm. It was confirmed that the composition of the resultant transparent conductive film was nearly the same as that of the target.

By measurement of specific resistance of the film, it was found to be $2.6 \times 10^{-4}$ Ω·cm. In addition, measurement of hole effect was performed and found that carrier electron concentration was $7.3 \times 10^{20}$ cm$^{-3}$, and carrier electron mobility was 33 cm$^2$V$^{-1}$s$^{-1}$. Refractive index of a wavelength of 460 nm was as low as 2.04. Crystallinity of the film was identified by X-ray diffraction measurement, and confirmed to be to be a crystalline film composed of an indium oxide phase only, and cerium and tin to be in a solid solution state in the indium oxide phase.

TABLE 1

| | Ce/(In + Ce) (% by atom) | M element | Ce/(In + Ce + M) (% by atom) | M/(In + Ce + M) (% by atom) | Main phase of sintered body | Second phase of sintered body | CeO$_2$ phase (111)/ In$_2$O$_3$ phase (222) | Average particle diameter of CeO$_2$ phase (μm) | Sintered body density (g/cm$^3$) | Arcing | Specific resistance ($\times 10^{-4}$ Ω·cm) | Refractive index |
|---|---|---|---|---|---|---|---|---|---|---|---|---|
| Example 1 | 9 | — | — | — | bixbyite-type In$_2$O$_3$ phase | Fluorite-type CeO$_2$ phase | 16% | 1.1 | 6.87 | None | 6.6 | 2.21 |
| Example 2 | 7 | — | — | — | | | 14% | 2.7 | 6.88 | | 5.4 | 2.20 |
| Example 3 | 5 | — | — | — | | | 9% | 1.3 | 6.92 | | 4.6 | 2.19 |
| Example 4 | 4 | — | — | — | | | 8% | 2.8 | 6.91 | | 4.2 | 2.17 |
| Example 5 | 1 | — | — | — | | | 2% | 1.1 | 6.86 | | 4.4 | 2.14 |
| Example 6 | 0.3 | — | — | — | | | 0.5% | 1.2 | 6.70 | | 7.6 | 2.13 |
| Reference Example 1 | — | Ti | 8 | 1 | | | 25% | 2.7 | 7.06 | | 5.6 | 2.14 |
| Reference Example 2 | — | Ti | 5 | 0.5 | | | 14% | 1.5 | 7.01 | | 5.4 | 2.17 |
| Reference Example 3 | — | Ti | 4 | 1 | | | 7% | 1.1 | 7.06 | | 5 | 2.16 |
| Reference Example 4 | — | Ti | 0.3 | 0.3 | | | 1% | 1.0 | 7.05 | | 5 | 2.12 |
| Reference Example 5 | — | Zr | 0.3 | 0.3 | | | 1% | 1.0 | 6.98 | | 5.2 | 2.12 |
| Example 7 | 2 | — | — | — | | | 4% | 1.0 | 4.67 | | 3.3 | 2.13 |
| Comparative Example 1 | 0.1 | — | — | — | | — | — | 1.0 | 6.74 | | 13 | 2.12 |
| Comparative Example 2 | 11 | — | — | — | | Fluorite-type CeO$_2$ phase | 28% | 2.6 | 6.69 | | 10 | 2.18 |
| Comparative Example 3 | 9 | — | — | — | | | 18% | 4.2 | 6.72 | Yes | — | — |
| Comparative Example 4 | — | Ti | 0.3 | 3 | | — | — | — | 7.04 | None | 3 | 2.07 |
| Comparative Example 5 | — | Sn | 0.3 | 3 | | — | — | — | 7.09 | | 2.6 | 2.04 |

(Evaluation)

From the result shown in Table 1, in Examples 1 to 6, the oxide sintered bodies (the first oxide sintered bodies) composed of an indium oxide and a cerium oxide were prepared, by using indium oxide powder and cerium oxide powder adjusted to have an average particle diameter of equal to or smaller than 1.5 μm, to blend in a range of a cerium content of 0.3 to 9% by atom, as an atomicity ratio of Ce/(In+Ce), and it was confirmed that the oxide sintered bodies had a sintered body texture having the In$_2$O$_3$ phase of a bixbyite-type structure, as a main crystal phase, finely dispersed with a CeO$_2$ phase of a fluorite-type structure, as a second phase, as crystal grains having an average particle diameter of equal to or smaller than 3 μm. Still more, it was confirmed that, as for relation between particle diameter and a dispersed state of the crystal grains of the In$_2$O$_3$ phase and the CeO$_2$ phase, X-ray diffraction peak intensity ratio of the CeO$_2$ phase (111) relative to the In$_2$O$_3$ phase (222) is equal to or lower than 25%.

In addition, in Reference Examples 1 to 5, it was confirmed that the oxide sintered bodies were prepared, which contained indium, cerium and the M element as oxides, by using the indium oxide powder and the cerium oxide powder, and oxide powder of at least one or more kinds of the M element selected from the metal element group consisting of titanium, zirconium, hafnium, molybdenum and tungsten, adjusted to have an average particle diameter of equal to or smaller than 1.5 μm, and blending them in a range of the cerium content of 0.3 to 9% by atom, as an atomicity ratio of Ce/(In+Ce), the M element content of equal to or lower than 1% by atom, as an atomicity ratio of M/(In+Ce+M), and the total content of cerium and the M element of equal to or lower than 9% by atom, as an atomicity ratio of (Ce+M)/(In+Ce+M); and they had a finely dispersed texture similar to that of the oxide sintered bodies of Examples 1 to 6.

The oxide sintered bodies of Reference Examples 1 to 5 all showed such high density as a density of the sintered body of equal to or higher than 6.3 g/cm$^3$. When these oxide sintered bodies were used as a sputtering target to perform direct-current sputtering, it was clarified that, even after continuous sputtering for a long period of time, generation of a nodule started from a digging residue of sputtering caused by the CeO$_2$ phase was not observed, and even when direct-current power was changed within a range of 200 to 600 W, arcing did not generate.

It was confirmed that specific resistance of the crystalline transparent conductive films formed in Reference Examples 1 to 5 was as good as equal to or lower than 8×10$^{-4}$ Ω·cm, and this low specific resistance depends on high carrier electron mobility over 35 cm$^2$V$^{-1}$s$^{-1}$. At the same time, as for optical characteristics, it was confirmed that, because of suppression of the carrier electron concentration to a low level, refractive index in a wavelength of 460 nm showed such high value as over 2.1. It should be noted that, in Reference Example 3, refractive index in a wavelength of 460 nm showed such high value as over 2.1, although the carrier electron mobility was low because of being amorphous.

As compared with Reference Examples 1 to 5, in Comparative Example 1, the cerium content is set at 0.1% by atom, as an atomicity ratio of Ce/(In+Ce), outside the range of the present invention. Because of too low cerium content, the crystalline transparent conductive film formed was not able to attain sufficient carrier electron concentration, and showed a specific resistance of 1.3×10$^{-3}$ Ω·cm, not attaining the level of equal to or lower than 8×10$^{-4}$ Ω·cm, required in applications of a blue LED or a solar cell and the like.

Similarly, in Comparative Example 2, the cerium content is set at 11% by atom, as an atomicity ratio of Ce/(In+Ce), outside the range of the present invention. Because of too high cerium content, the crystalline transparent conductive film formed had low carrier electron mobility, and showed a specific resistance of 1.0×10$^{-3}$ Ω·cm, not attaining the level of equal to or lower than 8×10$^{-4}$ Ω·cm, required in applications of a blue LED or a solar cell and the like.

As compared with Reference Examples 1 to 5, in Comparative Example 3, because of using relatively coarse cerium oxide powder having a average particle diameter of 2 μm, as raw material powder, average particle diameter of the crystal grain composed of the CeO$_2$ phase dispersed in the oxide sintered body was over 3 μm. When direct-current sputtering was performed using the oxide sintered body having such a texture as a sputtering target, it was confirmed that nodules generated and arcing generated frequently after continuous sputtering for a long period of time. That is, it was clarified that, as in Examples 1 to 6, the texture of the oxide sintered body, having the finely dispersed crystal grains composed of the CeO$_2$ phase, so as to have an average particle diameter of equal to or smaller than 3 μm, by using the cerium oxide powder adjusted to have an average particle diameter of equal to or smaller than 1.5 μm, is effective to suppress nodule generation and arcing generation.

As compared with Reference Examples 1 to 5, in Comparative Example 4, the titanium content is set at 3% by atom, as an atomicity ratio of Ti/(In+Ce+Ti), outside the range of the present invention. Because of too high titanium content, the crystalline transparent conductive film formed had too high carrier electron concentration, and showed a refractive index of 2.07, not attaining the level of 2.1, required in applications of a blue LED and the like.

The oxide sintered body of Comparative Example 5 contains tin different from the composition element of the oxide sintered body of the present invention, with the tin content of 3% by atom, as an atomicity ratio of Sn/(In+Ce+Sn), other than indium and cerium. Because of containing tin, the crystalline transparent conductive film formed had too high carrier electron concentration, and showed a refractive index of 2.04, not attaining the level of 2.1, required in applications of a blue LED and the like.

INDUSTRIAL APPLICABILITY

The oxide sintered body containing indium, cerium and the M element, of the present invention, may be used in producing the oxide transparent conductive film by sputtering method. This transparent conductive film is extremely useful industrially as a surface electrode for a blue LED (Light Emitting Diode) or a solar cell, and as a high refractive index film for an optical disk.

What is claimed is:

1. A oxide sintered body comprising an indium oxide and a cerium oxide, wherein the cerium content is 0.3 to 9% by atom, as an atomicity ratio of Ce/(In+Ce), and the content of cerium is equal to or lower than 9% by atom, as an atomicity ratio of Ce/(In+Ce),
   said oxide sintered body has an In$_2$O$_3$ phase of a bixbyite structure as a main crystal phase, has a CeO$_2$ phase of a fluorite-type structure finely dispersed as crystal grains having an average particle diameter of equal to or smaller than 3 μm, as a second phase.

2. The oxide sintered body according to claim 1, characterized in that X-ray diffraction peak intensity ratio (I), defined by the following formula, is equal to or lower than 25%:

I=[CeO$_2$phase(111)/In$_2$O$_3$phase(222)]×100[%].

3. A target for sputtering obtained by fabricating the oxide sintered body according to claim 2, wherein density of the oxide sintered body is equal to or higher than 6.3 g/cm$^3$.

4. The oxide sintered body according to claim 1, wherein the oxide sintered body does not comprise tin.

5. A target for sputtering obtained by fabricating the oxide sintered body according to claim 4, wherein density of the oxide sintered body is equal to or higher than 6.3 g/cm$^3$.

6. A target for sputtering obtained by fabricating the oxide sintered body according to claim 1, wherein density of the oxide sintered body is equal to or higher than 6.3 g/cm$^3$.

* * * * *